US012592704B2

(12) United States Patent
Fujibayashi

(10) Patent No.: US 12,592,704 B2
(45) Date of Patent: Mar. 31, 2026

(54) TD CONVERTER, PLL CIRCUIT, TD CONVERTING METHOD, AND CLOCK GENERATING METHOD

(71) Applicant: Asahi Kasei Microdevices Corporation, Tokyo (JP)

(72) Inventor: Takeji Fujibayashi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 205 days.

(21) Appl. No.: 18/464,252

(22) Filed: Sep. 10, 2023

(65) Prior Publication Data

US 2024/0088907 A1 Mar. 14, 2024

(30) Foreign Application Priority Data

Sep. 12, 2022 (JP) ................................. 2022-144397

(51) Int. Cl.
| | |
|---|---|
| *H03L 7/099* | (2006.01) |
| *G04F 10/00* | (2006.01) |
| *H03L 7/081* | (2006.01) |
| *H03L 7/085* | (2006.01) |

(52) U.S. Cl.
CPC .......... *H03L 7/0995* (2013.01); *G04F 10/005* (2013.01); *H03L 7/081* (2013.01); *H03L 7/085* (2013.01)

(58) Field of Classification Search
CPC ....... H03L 7/0995; H03L 7/081; H03L 7/085; G04F 10/005
See application file for complete search history.

(56) References Cited

U.S. PATENT DOCUMENTS

| | | | |
|---|---|---|---|
| 9,588,497 B1 | 3/2017 | Monk | |
| 10,222,759 B2 * | 3/2019 | Maki | H03L 7/18 |
| 10,476,657 B2 * | 11/2019 | Wang | H04L 7/0087 |
| 10,520,901 B2 * | 12/2019 | Wu | H03L 7/187 |
| 10,884,041 B2 * | 1/2021 | Maki | H03K 21/023 |
| 10,908,558 B2 * | 2/2021 | Kurashina | H03L 7/18 |
| 11,070,212 B2 * | 7/2021 | Sudo | G06N 3/09 |
| 2003/0099217 A1 | 5/2003 | Castor | |
| 2012/0044102 A1 | 2/2012 | Henzler | |
| 2012/0286987 A1 | 11/2012 | Kawaguchi | |
| 2013/0307713 A1 | 11/2013 | Kawaguchi | |
| 2014/0218009 A1 | 8/2014 | Canard | |
| 2015/0145572 A1 * | 5/2015 | Sato | H03L 7/0992 |
| | | | 327/159 |

(Continued)

FOREIGN PATENT DOCUMENTS

| | | | | |
|---|---|---|---|---|
| CN | 117692005 A | * | 3/2024 | .......... H03L 7/0891 |
| JP | 2016031274 A | | 3/2016 | |

(Continued)

*Primary Examiner* — Adam D Houston

(57) ABSTRACT

Provided is a TD converter including: a plurality of oscillators which at least include a first oscillator and a second oscillator receiving control signals input thereto, respectively, and operating in operating modes with oscillation frequencies different from each other, respectively, wherein each control signal indicates a time difference between a reference clock and a target clock; and a computation circuit which calculates a digital output value depending on the time difference, by using a plurality of pieces of phase information retained according to the reference clock in the plurality of oscillators, respectively.

21 Claims, 38 Drawing Sheets

(56) References Cited

U.S. PATENT DOCUMENTS

| | | | | |
|---|---|---|---|---|
| 2016/0112053 A1* | 4/2016 | Perrott | ................ | H03M 1/0836 |
| | | | | 327/156 |
| 2018/0088160 A1* | 3/2018 | Maki | ...................... | G01R 23/10 |
| 2018/0088536 A1* | 3/2018 | Kurashina | ................. | H03L 7/18 |
| 2018/0091156 A1* | 3/2018 | Maki | ........................ | H03L 7/085 |
| 2018/0091158 A1* | 3/2018 | Sudo | ...................... | H03L 7/087 |
| 2019/0064749 A1* | 2/2019 | Sudo | .................... | H03L 7/0996 |
| 2021/0389730 A1 | 12/2021 | Zhou | | |
| 2024/0088907 A1* | 3/2024 | Fujibayashi | .......... | H03L 7/0995 |
| 2025/0141456 A1* | 5/2025 | Lu | ............................ | H03L 7/07 |

FOREIGN PATENT DOCUMENTS

| | | | | | |
|---|---|---|---|---|---|
| WO | WO-0169328 A2 * | 9/2001 | ............. | G04F 10/00 |
| WO | WO-2018158614 A1 * | 9/2018 | ............. | H03L 7/085 |

\* cited by examiner

CONTROL SIGNAL

410

TD CONVERTER, PLL CIRCUIT, TD CONVERTING METHOD, AND CLOCK GENERATING METHOD

The contents of the following patent application(s) are incorporated herein by reference:

NO. 2022-144397 filed in JP on Sep. 12, 2022

BACKGROUND

1. Technical Field

The present invention relates to a TD converter, a PLL circuit, a TD converting method, and a clock generating method.

2. Related Art

Patent Literature 1 discloses a "device for measuring a duration time of a level of an electric signal". Patent Literature 2 discloses a "TD (Time to Digital) converter using computation in the time domain".

PRIOR ART DOCUMENT

Patent Literature

Patent Literature 1: U.S. Patent Application Publication No. 2014/0218009

Patent Literature 2: Japanese Patent Application Publication No. 2014-003580

DESCRIPTION OF EXEMPLARY EMBODIMENTS

Hereinafter, embodiments of the present invention will be described. However, the following embodiments are not for limiting the invention according to the claims. In addition, not all combinations of features described in the embodiment are essential to the solution of the invention.

With advances in the miniaturization in the CMOS LSI fabrication process and the resultant power supply of a lower voltage, a digital circuit has significantly been improved in terms of a reduced area, a lower power consumption, and a higher speed. On the other hand, an analog circuit cannot benefit from the miniaturization due to increased variances of characteristics, increased leakage currents, or the like, whereby the improvements of the reduced area, the lower power consumption, and higher speed are limited. Therefore, in accordance with the miniaturization of the process, some or all parts of a circuit which have conventionally been implemented by an analog circuit are principally replaced and implemented by a digital circuit.

A PLL (Phase Locked Loop) circuit is one example. The PLL circuit is a circuit to output a signal from another oscillator circuit through the feedback control, where the signal has the same frequency as and has a phase synchronized with a reference clock input thereto. The PLL circuit is used in a broad range of applications such as a clock generator to generate a high frequency clock with a high accuracy and a frequency synthesizer in a communication IC.

Figure 1:
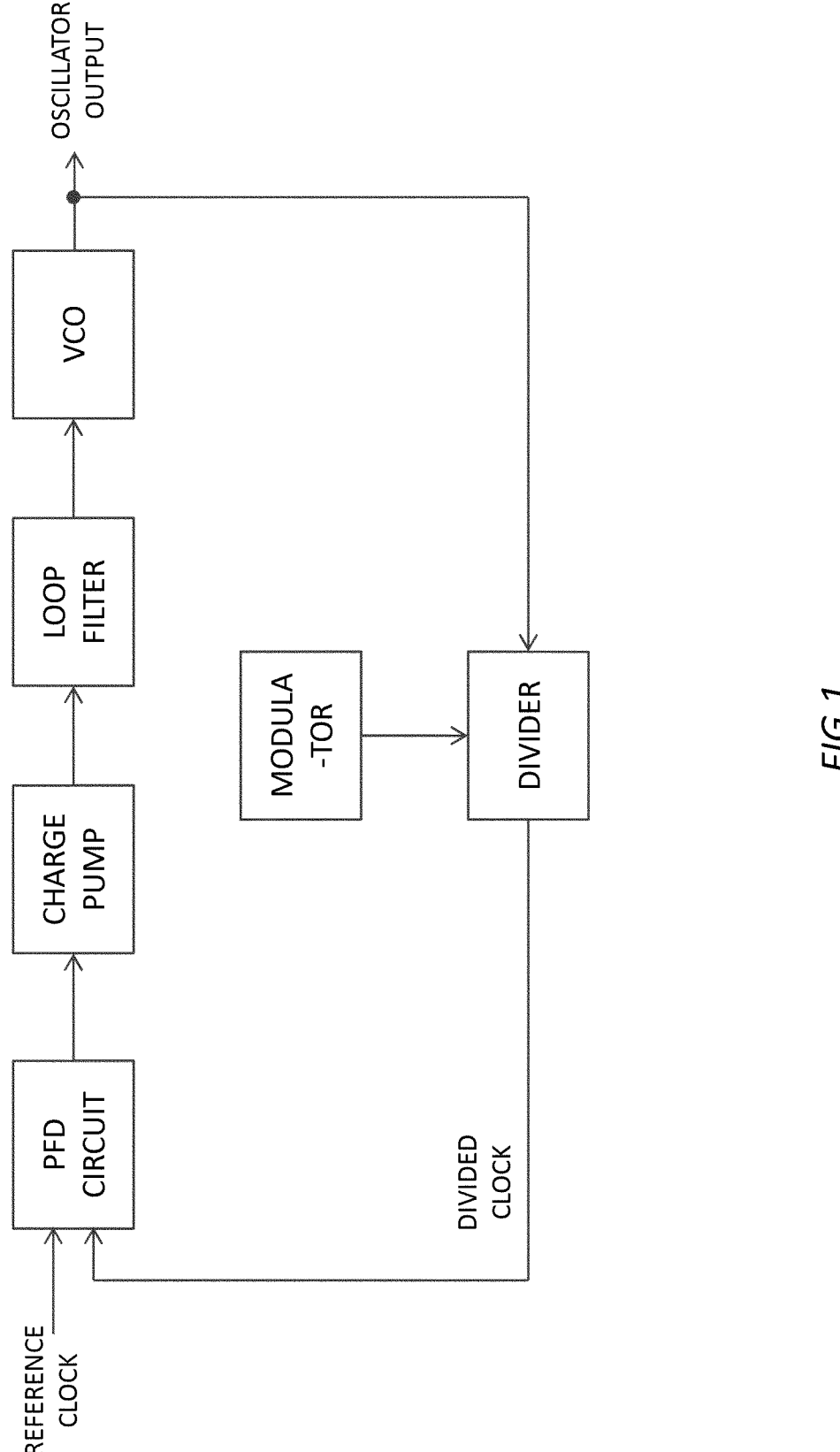
FIG. 1 illustrates an example configuration of a conventional PLL circuit.

FIG. 1 illustrates an example configuration of a conventional PLL circuit. In the conventional PLL circuit, a large portion of the area is occupied with parts configured with analog circuits such as a charge pump and a loop filter, which prevents a chip of a reduced area. In addition, the characteristics of these analog circuits vary due to the variance of fabrication and leakage currents, which also prevents a PLL circuit of a higher speed, a higher performance, and a higher robustness.

On the other hand, an ALL Digital PLL (ADPLL) circuit, a PLL circuit within which analog circuits are replaced with digital circuits, benefits from the miniaturization of the process such that the performance can be expected to be improved such as a reduced area, a lower power consumption, and a higher speed, with advances in the miniaturization and the lower voltage.

Figure 2:
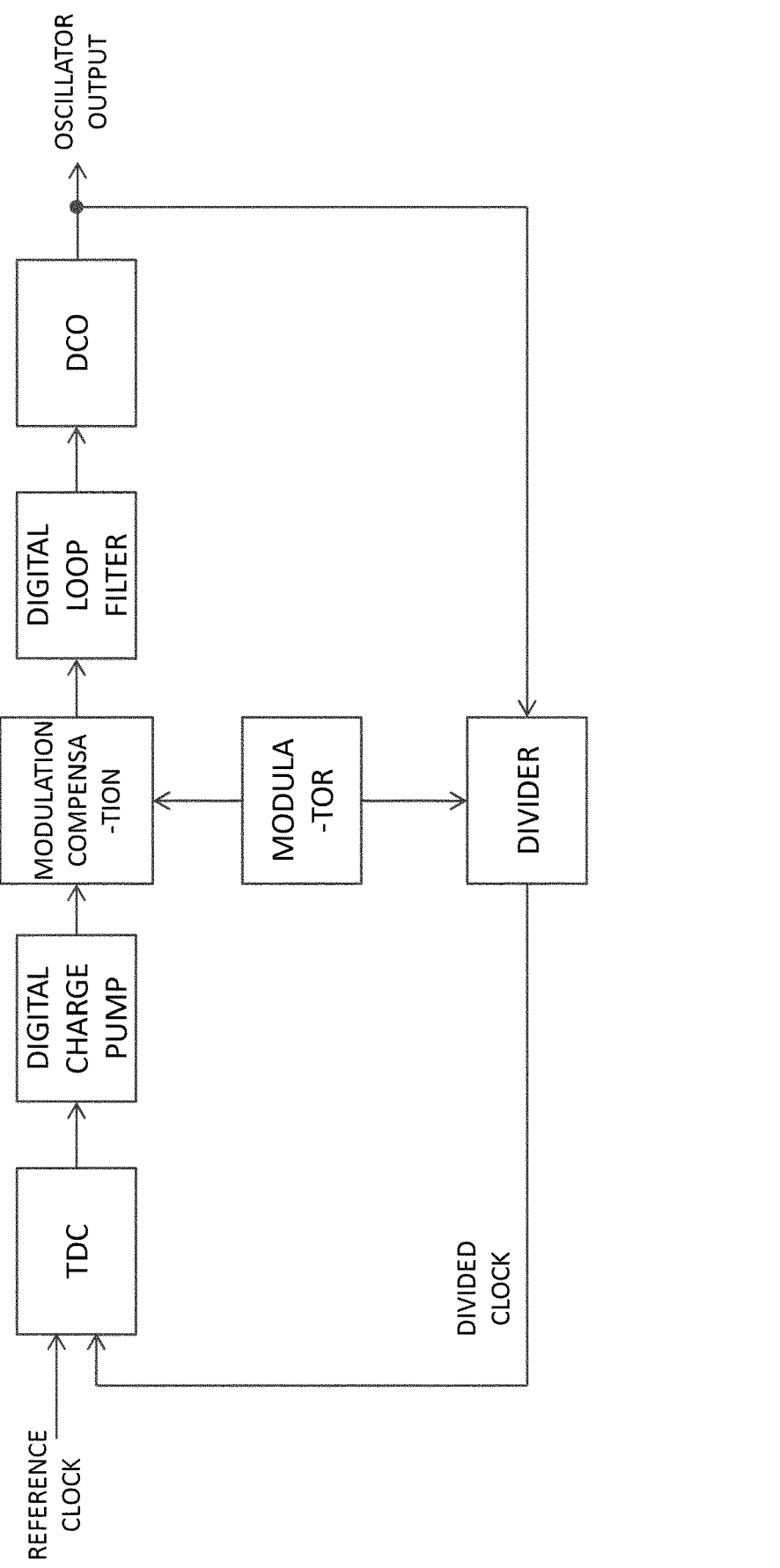
FIG. 2 illustrates an example configuration of an ADPLL circuit.

FIG. 2 illustrates an example configuration of an ADPLL circuit. In the ADPLL circuit, each block is configured with digital circuits such that design, inspection, and test methods of each circuit can be carried out in the manner similar to other digital circuits and therefore the circuits can easily be modified in accordance with the modification of the process. Further, as a charge pump and a loop filter are replaced with digital circuits, the characteristics are ensured to remain unchanged regardless of variances of the fabrication process, the power supply voltage and the temperature in these blocks, thereby largely improving the robustness of the entire PLL. Further, as a charge pump is replaced with a digital circuit, the amount of modulation noise components generated in the Fractional-N PLL can be predicted with a high accuracy such that the noises can significantly be removed.

Therefore, the ADPLL circuit is a very important technique for obtaining a PLL circuit of a reduced area and a higher robustness.

In the ADPLL circuit, a block which is configured with a PFD (Phase Frequency Detector) circuit and a charge pump circuit in the conventional PLL circuit is replaced with a TD converter (Time to Digital Converter: TDC) and a digital charge pump circuit, as illustrated in FIG. 2. In the ADPLL circuit, the TDC circuit outputs a digital output value indicating a time difference between a reference clock and a target clock, and digital circuits such as a charge pump, a modulation compensation circuit, and a digital loop filter supply a digital control signal in accordance with the digital output value of the TDC circuit to an oscillator such as a DCO. This allows the oscillator such as a DCO to output an output clock with a frequency depending on the digital output value output by the TDC circuit. In addition, the TDC circuit receives a feedback clock in accordance with the output clock, that is, a feedback clock such as an output clock itself or a divided clock obtained by dividing the output clock, for example, input thereto as a target clock which acts as a target for comparison of the time difference by the TDC circuit. In such an ADPLL circuit, the time resolution of the TDC is exactly a resolution of the comparison of the time difference between the reference clock and the divided clock which is a feedback clock, which makes one of the main factors of phase noises in the PLL circuit. That is, the TDC of a high time resolution is required to implement a PLL circuit of a good noise performance.

Figure 3:
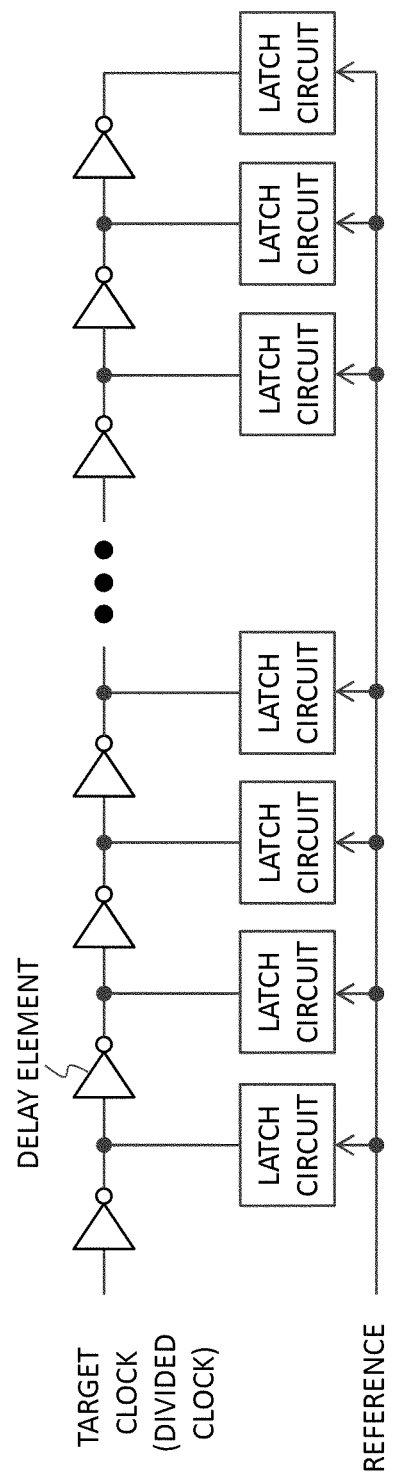
FIG. 3 illustrates an example configuration of the conventional TDC.

FIG. 3 illustrates an example configuration of the conventional TDC. The conventional TDC is configured with cascaded delay elements and a latch circuit which retains (latches) an output value of each delay element. The latch circuit receives a reference clock input thereto immediately after a target clock (for example, the "divided clock" in FIG. 2) is input (an input of a leading edge or a trailing edge) and retains an output value of the delay element, respectively. In such a TDC, a time difference between the target clock and the reference clock can be quantized by a delay time of the delay element and converted to a digital value by observing what number of the cascaded delay elements a point of change of the target clock is propagated to.

Figure 4:
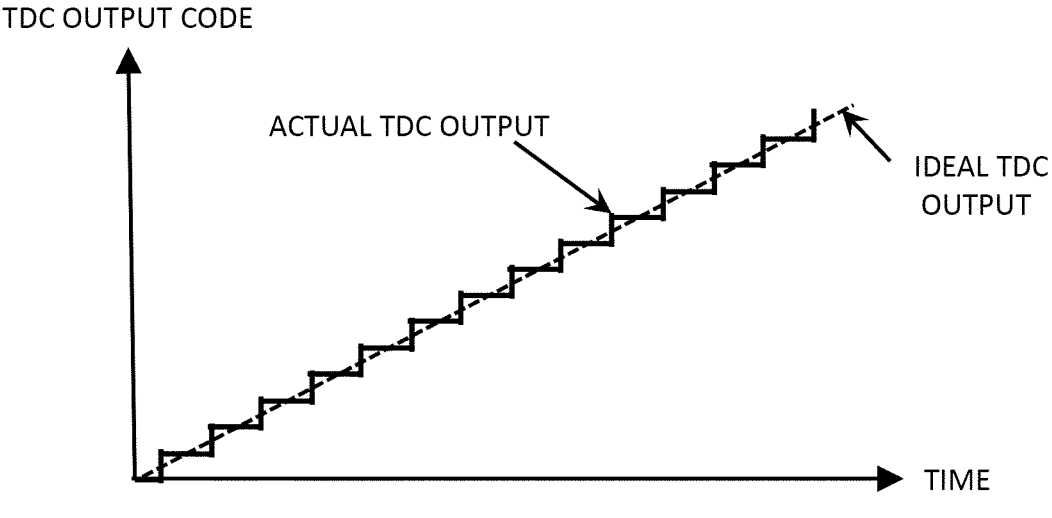
FIG. 4 illustrates a diagram which depicts the conventional TDC conversion.

FIG. 4 illustrates a diagram which depicts the conventional TDC conversion. In the present figure, the vertical axis indicates a TDC output code and the horizontal axis indicates a time. In addition, in the present figure, a dotted line indicates an ideal TDC output and a solid line indicates an actual TDC output. In the TDC conversion, actual TDC outputs are obtained as digital values quantized in a stepped shape while ideal TDC outputs form a straight line, which causes a quantization error affecting a noise performance of the PLL. The time resolution of such a TDC depends on a delay time for one delay element. Therefore, the delay time of the delay element is required to be shorter for a finer time resolution, that is, for a smaller quantization error. On the other hand, for the configuration of the PLL circuit, the conversion range is also important for the correct TD conversion, not only the time resolution. In the example configuration of FIG. 3, assuming that N delay elements are cascaded and each delay element involves a delay $\tau$, for example, the time difference between 0 and $N\times\tau$ allows the correct TD conversion. The PLL needs to have a broad TD conversion range sufficiently to perform frequency entrainment at a high speed. It is desirable for an ordinary PLL to have a range for one cycle of the reference clock, and the number of stages N of the delay elements is set in accordance with it. Therefore, a finer time resolution requires an increased number of stages N of delay elements correspondingly, which results in a larger scale of the circuit. An example circuit to solve such an issue is illustrated in the next figure.

Figure 5:
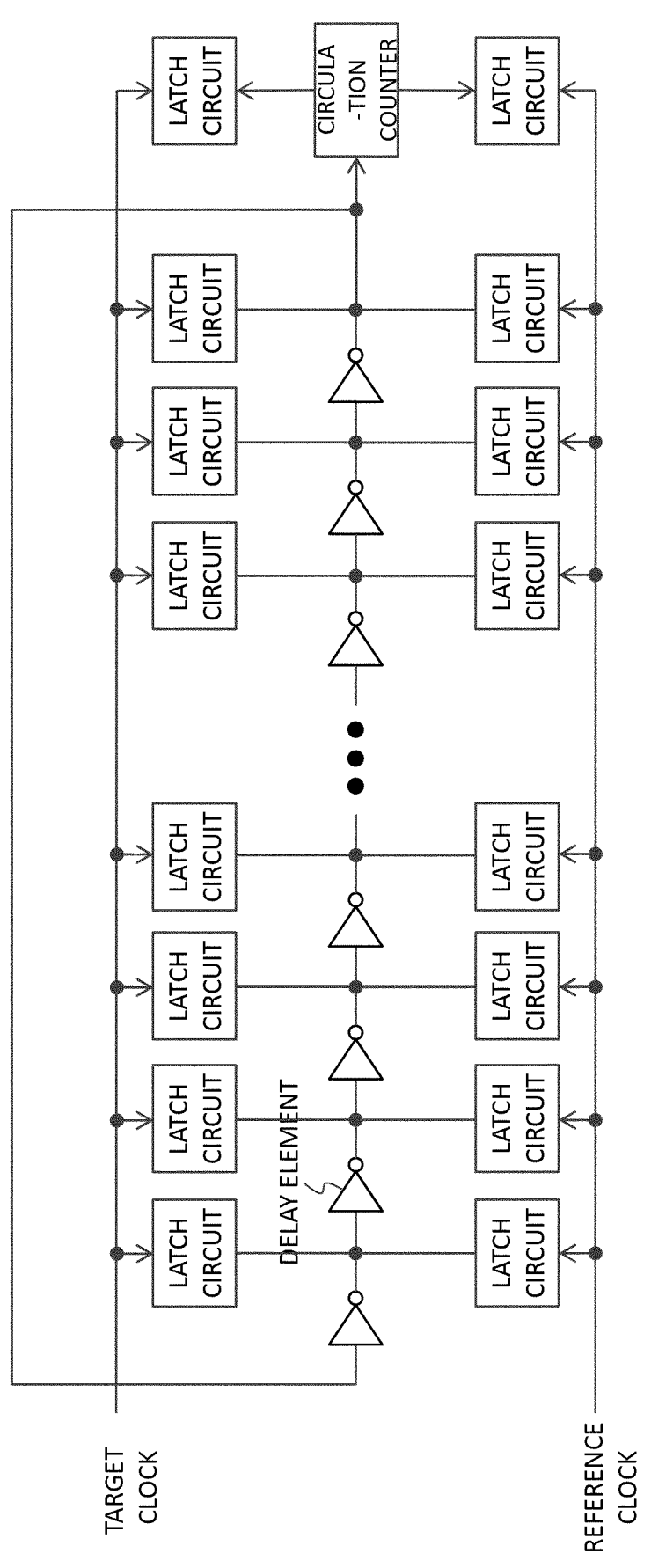
FIG. 5 illustrates an example configuration of an oscillator used in the TDC in the prior art.

FIG. 5 illustrates an example configuration of an oscillator used in the TDC in the prior art. In this example configuration, the cascaded delay elements are in a looped shape to form a ring oscillator. In this configuration, in general, an inverter of which an input and an output have opposite polarities is used as a delay element and the number of stages N of delay elements is an odd number. Such an oscillator is provided with two latch circuits at an output of each delay element forming a ring oscillator which retain output values at the timings of the target clock and the reference clock, respectively. In addition, such an oscillator is provided with a circulation counter which counts up or counts down the circulation count every time a point of change of the delay element in the ring oscillator goes round, and further provided with two latch circuits which retain the counts of the circulation counter at the timings of the target clock and the reference clock, respectively. In such a configuration, if a value of the circulation counter retained at the timing of the target clock is M, and a point of change of the delay element is positioned at the Kth stage, and then if a value of the circulation counter retained at the timing of the reference clock is M+m, and a point of change of the delay element is positioned at the (K+k)th stage, for example, a time difference $\Delta t$ between the reference clock and the target clock is: $\Delta t = \tau \times [\{N \times (M+m-M)\} + (K+k-K)] = \tau \times (Nm+k)$, where a delay time for one stage of the delay element is r. This is illustrated in the next figure.

Figure 6:
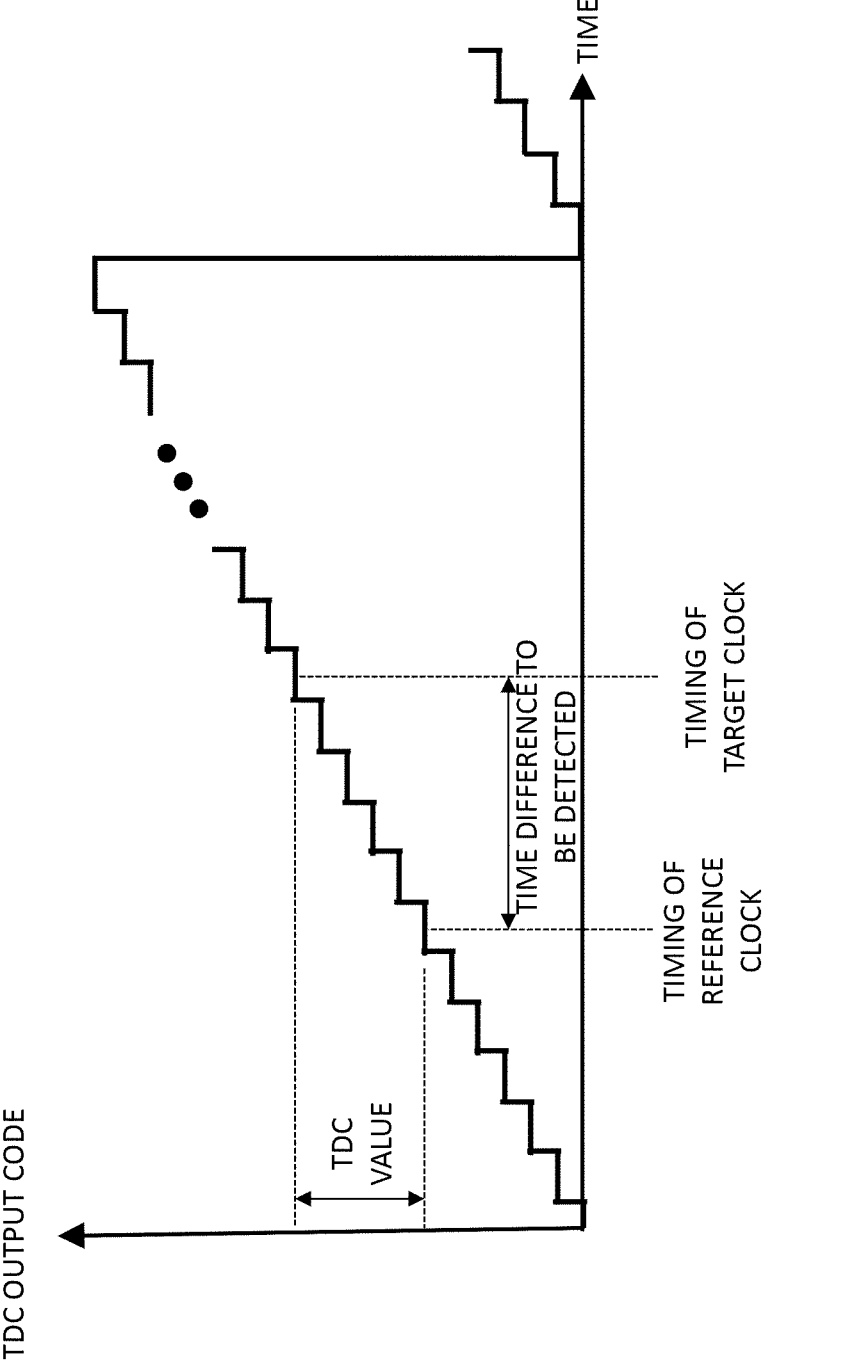
FIG. 6 illustrates a diagram which depicts the TDC conversion in the prior art.

FIG. 6 illustrates a diagram which depicts the TDC conversion in the prior art. In the present figure, the vertical axis indicates a TDC output code and the horizontal axis indicates a time. The TDC output increases in a stepped shape over time and returns to 0 (performs a reset operation) when the circulation counter reaches the maximum value which can be counted. In such a TDC conversion, the TDC output codes are retained at the timing of the reference clock and at the timing of the target clock, respectively, and a difference between the respective TDC output codes is treated as a TDC value. The example configuration of the TDC to implement such a computation is illustrated in the next figure.

Figure 7:
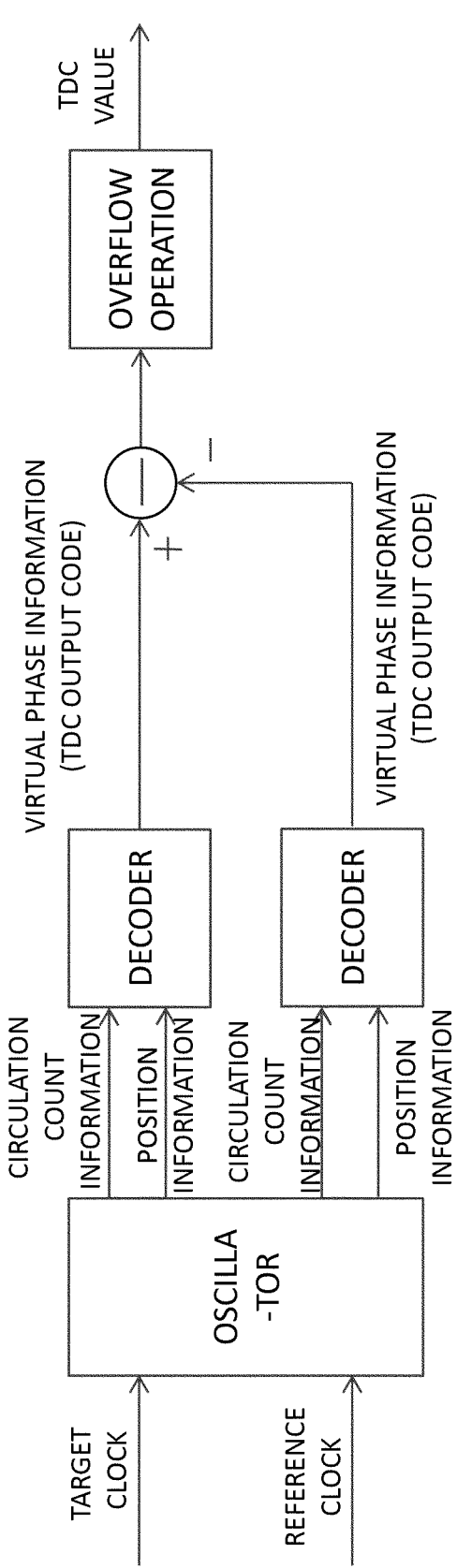
FIG. 7 illustrates an example configuration of the TDC in the prior art.

FIG. 7 illustrates an example configuration of the TDC in the prior art. In the TDC in the prior art, the reference clock and the target clock are input to the oscillator, and the oscillator outputs, as phase information, circulation count information which is a value of the circulation counter at the timing of the reference clock and the timing of the target clock and position information which is a position of a point of change of the delay element, respectively. Then, the decoder performs a computation of the circulation count information×the number of stages N+the position information to calculate virtual phase information which is the TDC output code. Then, after obtaining a difference between the respective pieces of the virtual phase information in the subtractor, an overflow operation is performed to obtain the TDC value. Note that, in such an overflow operation, if one of a latch timing of the reference clock and a latch timing of the target clock comes before the reset operation and the other comes after the reset operation due to the overflow of the circulation counter, for example, the result of the obtained difference may be a negative or an excessively large value. In this case, a value of the maximum value of the counter×the number of stages N is added or subtracted to process the value to be appropriate.

This circuit can ensure a broad range of the TD conversion without increasing the number of stages of the delay element, even if the delay time of the delay element is short. However, there is a disadvantage that the difference is obtained from the result of the quantization on both of the reference clock and the target clock, that is, the quantization is performed twice for one measurement, which increases the power of the quantization noise sqrt 2 times. The quantization noise can further be reduced by arranging a plurality of circuits having the same configuration to average the respective TDC values. However, the circuit scale and the power consumption are increased correspondingly. It is most effective to shorten the delay time of the delay element.

However, the limit of the delay time is determined by the performance of the fabrication process such as the performance and the capacity component of the transistor in general. Therefore, the delay time cannot easily be reduced.

Then, the prior art performed to reduce the quantization noise is the TDC in Patent Literature 1, as illustrated in the next figure.

Figure 8:
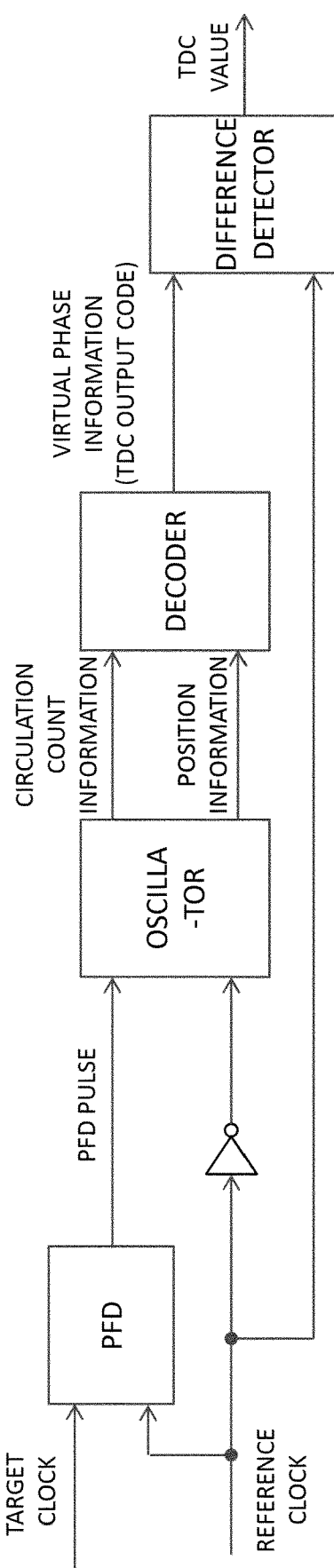
FIG. 8 illustrates an example configuration of the TDC in the Patent Literature 1.

FIG. 8 illustrates an example configuration of the TDC in the Patent Literature 1. In the Patent Literature 1, the TDC is configured with a PFD circuit which generates a PFD pulse signal having a width depending on a time difference between the reference clock and the target clock, an oscillator, a decoder, and a difference detector. The oscillator receives the PFD pulse signal generated in the PFD circuit and the reference clock (a signal having an inverted polarity with respect to the reference clock in this example) input thereto. Then, circulation count information and position information retained at the timing of the reference clock are output from the oscillator, and virtual phase information is calculated by the decoder. Subsequently, a difference is detected by the difference detector to obtain the TDC value.

Figure 9:
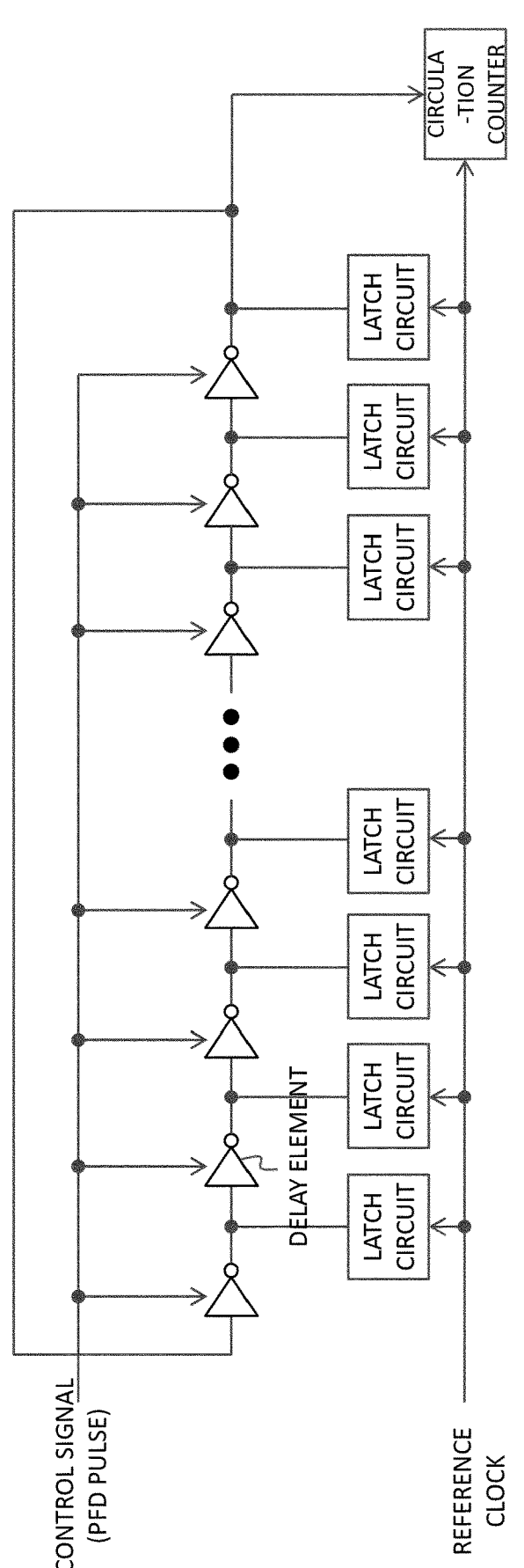
FIG. 9 illustrates an example configuration of an oscillator used in the TDC in the Patent Literature 1.

FIG. 9 illustrates an example configuration of an oscillator used in the TDC in the Patent Literature 1. Such an oscillator includes N stages of ring oscillators using an inverter as a delay element, and a latch circuit is connected to an output of each delay element, respectively, to retain an output value. In addition, the oscillator includes a circulation counter to count a circulation count of the ring oscillator. Each delay element configured with an inverter receives a PFD pulse input thereto, respectively, as a control signal to control the operating mode. The delay element is a circuit to switch the delay time by this control signal. For example, the delay element can switch the delay time such that the delay time is shorter when the control signal is High and the delay time is longer when the control signal is Low.

Figure 10:
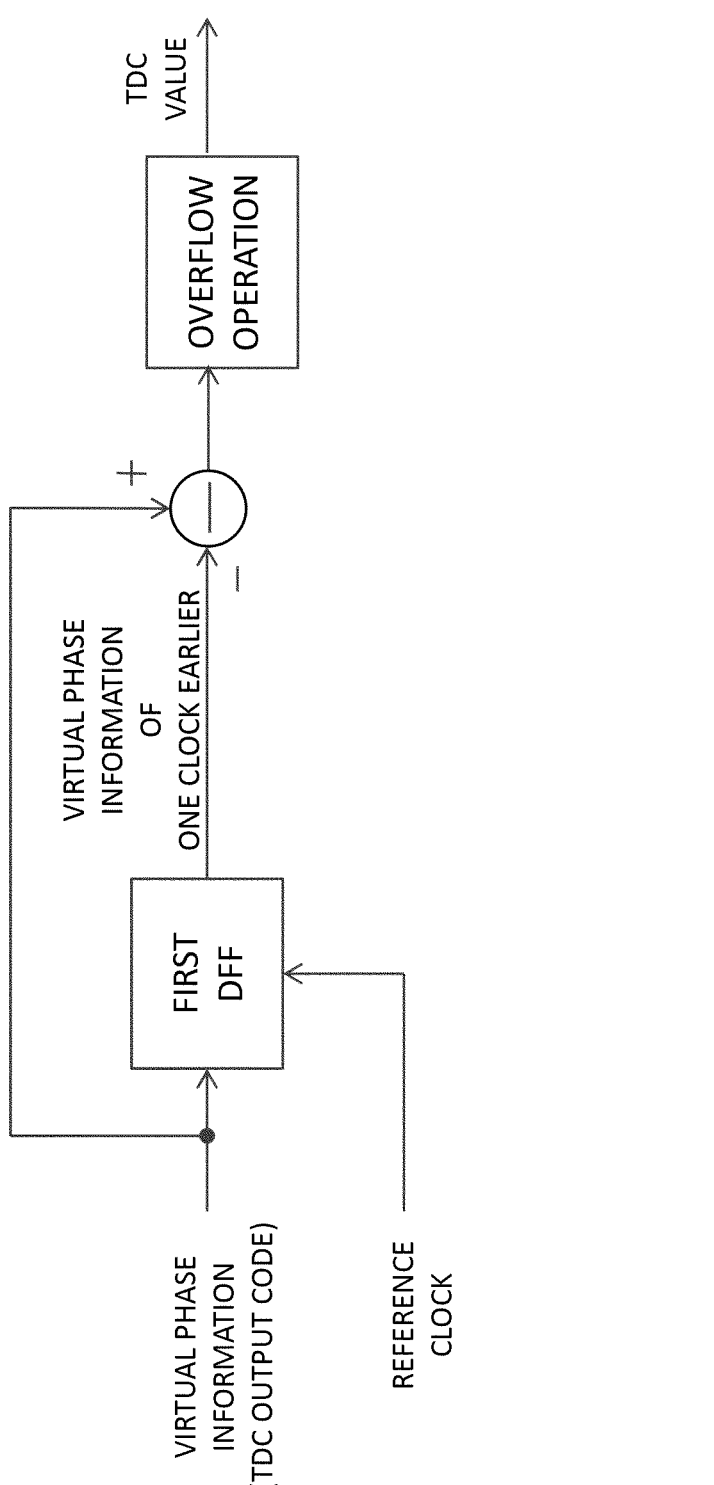
FIG. 10 illustrates an example configuration of a difference detector which may be used in the TDC in the Patent Literature 1.

FIG. 10 illustrates an example configuration of a difference detector which may be used in the TDC in the Patent Literature 1. The difference detector is configured with a first D-flip flop (DFF) which retains virtual phase information at the time when the reference clock is one clock earlier, a subtractor which computes a difference between the virtual phase information and an output of the first DFF input thereto, and an overflow operation unit, and outputs a value as a result of the overflow operation on the difference as a TDC value. The overflow operation is as described above and the explanation is omitted here.

Figure 11:
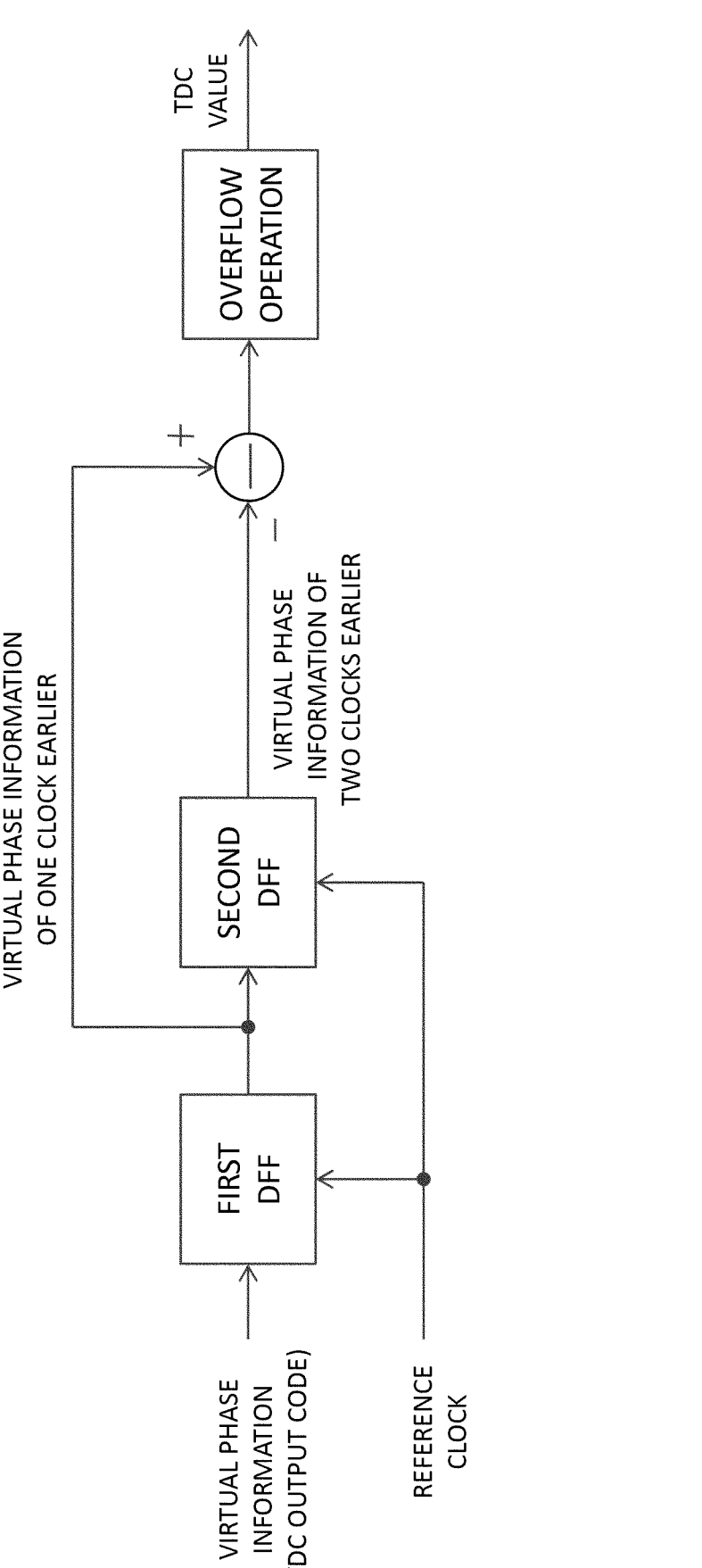
FIG. 11 illustrates another example configuration of a difference detector which may be used in the TDC in the Patent Literature 1.

FIG. 11 illustrates another example configuration of a difference detector which may be used in the TDC in the Patent Literature 1. Depending on the circuit configuration of the latch embedded in the oscillator, the state of the reference clock may release data retainment halfway. Therefore, the difference detector may be configured with a first DFF which fetches virtual position information to retain virtual phase information at the time when the reference clock is one clock earlier, a second DFF which fetches an output of the first DFF to retain virtual phase information at the time when the reference clock is two clocks earlier, a subtractor which computes a difference between an output of the first DFF and an output of the second DFF, and an overflow operation unit, and may output a value as a result of the overflow operation on the difference as a TDC value.

The TDC operations in the configurations described in FIG. 8 to FIG. 11 are described by using the figures.

Figure 12:
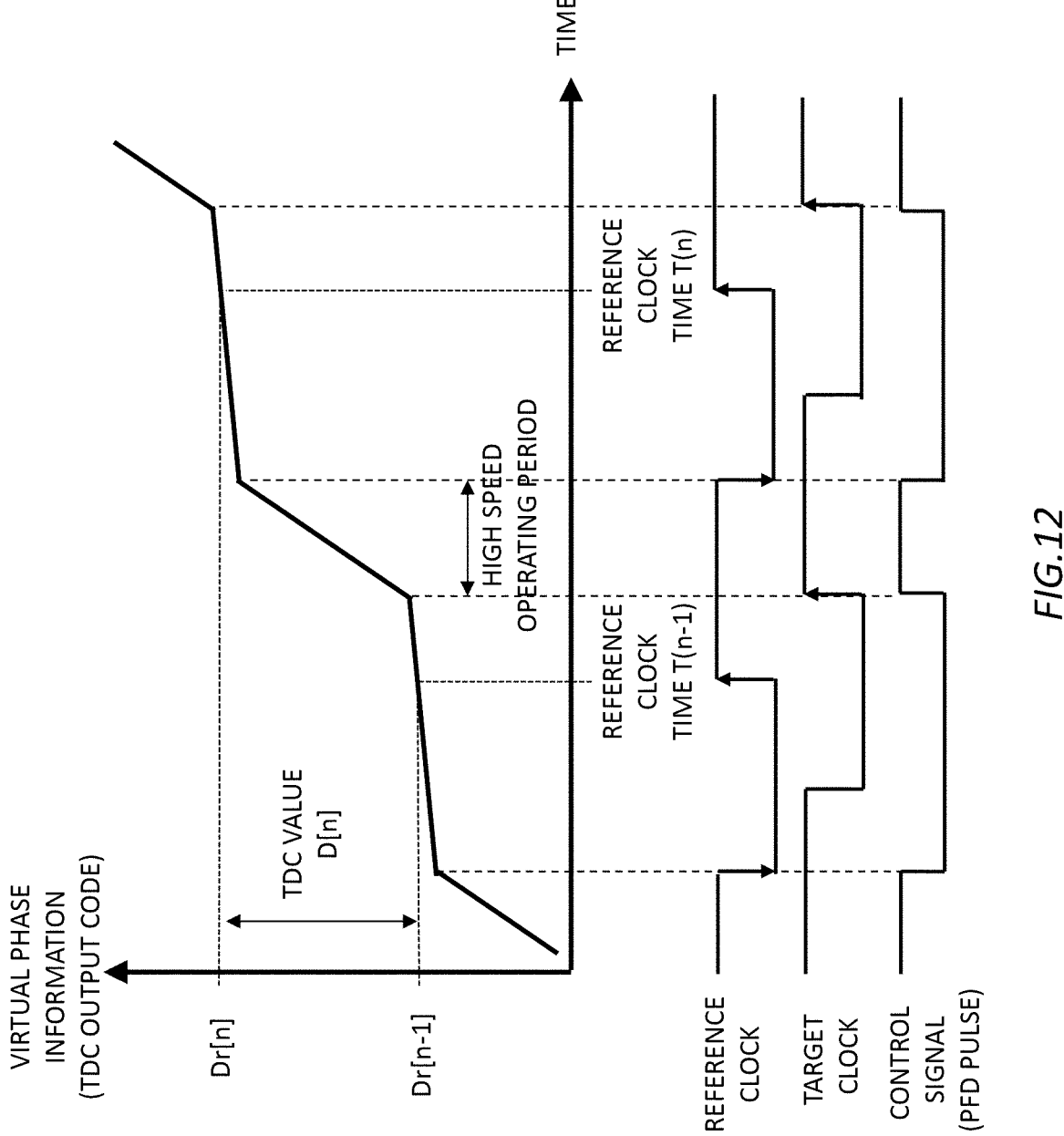
FIG. 12 illustrates a diagram which depicts the TDC conversion in the Patent Literature 1.

FIG. 12 illustrates a diagram which depicts the TDC conversion in the Patent Literature 1. In the present figure, the vertical axis indicates virtual phase information and the horizontal axis indicates a time. Note that the actual virtual phase information (that is, the TDC output code as a result of an output of the oscillator being decoded) is a quantum value so that the graph should be plotted as a very fine stepped waveform. In the present figure, however, it is depicted with a straight line for simplicity. As illustrated in the present figure, the TDC output increases with its gradient changing to be either one of two types over time. In the period when the PFD pulse is High, it is switched to shorten the delay time of the delay element such that the oscillator operates in a high speed operating mode with a high oscillation frequency. This makes a gradient at which the TDC output changes larger in the period when the PFD pulse is High. On the other hand, in the period when the PFD pulse is Low, it is switched to extend the delay time of the delay element such that the oscillator operates in a low speed operating mode with a low oscillation frequency. This makes a gradient at which the TDC output changes smaller in the period when the PFD pulse is Low. Note that the width of the period when the PFD pulse is High corresponds to the period a time from a rise of the target clock to a trail of the reference clock in the present figure. However, this is determined by the configuration of the PFD circuit and not necessarily required to meet this relationship. The virtual phase information is retained at the timing of the rise of the reference clock, and as illustrated in the figure, a difference between a value at the timing of the retainment and a value at the previous timing is a TDC value.

The behavior of the quantization noise in this configuration is described. The n-th TDC value D[n] is represented as D[n]=Dr[n]−Dr[n−1] by using the TDC output code Dr[n]. The TDC output code Dr[n] is represented as Dr[n]=Dt[n]+Er[n] by using a true value Dt[n] in the ideal TDC and a quantization error Er[n] generated in the quantization. That is, the n-th TDC value D[n] is D[n]=Dt[n]−Dt[n−1]+Er[n]−Er[n−1]. That is, the quantization error Eq[n] included in the n-th TDC value D[n] is Eq[n]=Er[n]−Er[n−1]. This is depicted in a model of the signal processing such that a value which delays by $Z^{-1}$ as illustrated in the next figure is subtracted.

Figure 13:
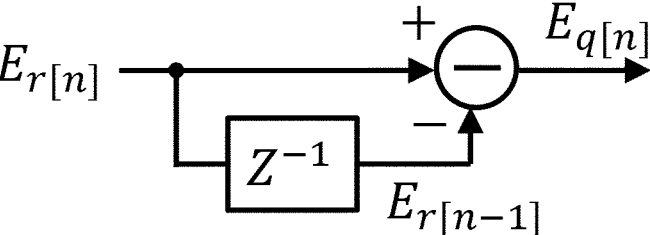
FIG. 13 illustrates a diagram which depicts a transmission model of a quantization noise of the TDC conversion in the Patent Literature 1.

FIG. 13 illustrates a diagram which depicts a transmission model of a quantization noise of the TDC conversion in the Patent Literature 1. The transmission function H(Z) of this signal processing model is represented by H(Z)=1−$Z^{-1}$ and its absolute value |H(Z)| is represented by the following equation. In this manner, it is appreciated that the TDC conversion in the Patent Literature 1 provides the noise shaping effect of the first derivation.

$$|H(Z)|^2 = 2\left(1 - \cos\frac{2\pi f}{fs}\right) \qquad \text{[Expession 1]}$$

Here, fs is a frequency of the reference clock and f is a frequency component of the noise. In general, the quantization noise is a white noise which is constantly distributed with respect to the frequency component. In this case, however, the noise shaping effect suppresses a component of a noise with a lower frequency. For example, assuming that the frequency of the reference clock is 80 MHz, a 1 MHz component of the quantization noise is suppressed by about 21 dB, which largely contributes reduction of a phase noise of the PLL. Next, the effect in this configuration will be described to suppress an influence on the phase noise with respect to changes in the power supply voltage. A response to a change in the power supply voltage when the TDC shown in FIG. 8 to FIG. 11 is used is illustrated in the next figure.

Figure 14:
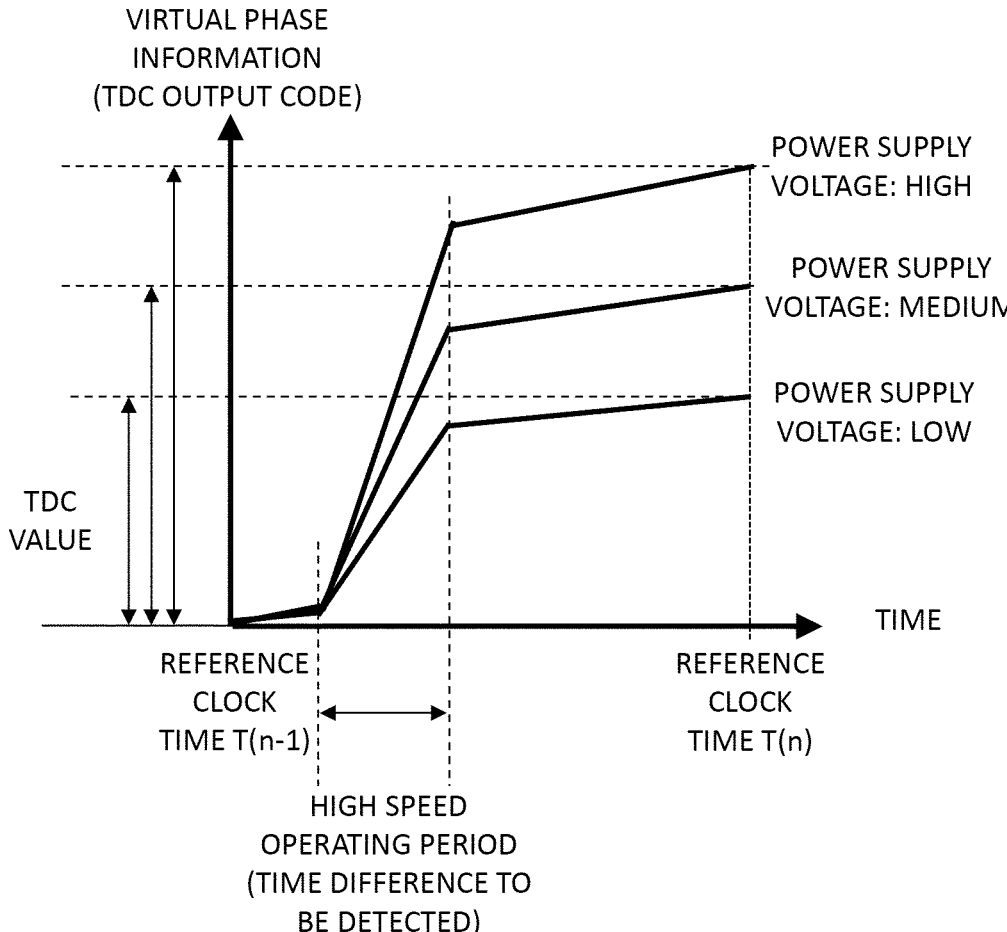
FIG. 14 illustrates a diagram which depicts the power supply dependency of the TDC conversion in the Patent Literature 1.

FIG. 14 illustrates a diagram which depicts the power supply dependency of the TDC conversion in the Patent Literature 1. Typically, the delay element illustrated in FIG. 9 is a simple inverter configured with a CMOS transistor. In general, a higher power supply voltage leads to a shorter delay time while a lower power supply voltage leads to a longer delay time. Therefore, even when the PFD pulses have the same width, the TDC values to be obtained largely vary depending on the power supply voltages. This means that, when the PLL is configured and fed back to maintain an output value of the TDC to be constant, the width of the PFD pulse varies when the PLL is locked due to the power supply voltage. That is, it means that a variance of the power supply voltage varies a phase of the divided clock such that a variance of the power supply voltage appears as a phase noise of the PLL. Then, the Patent Literature 1 employs a configuration illustrated in the next figure to address such an issue.

Figure 15:
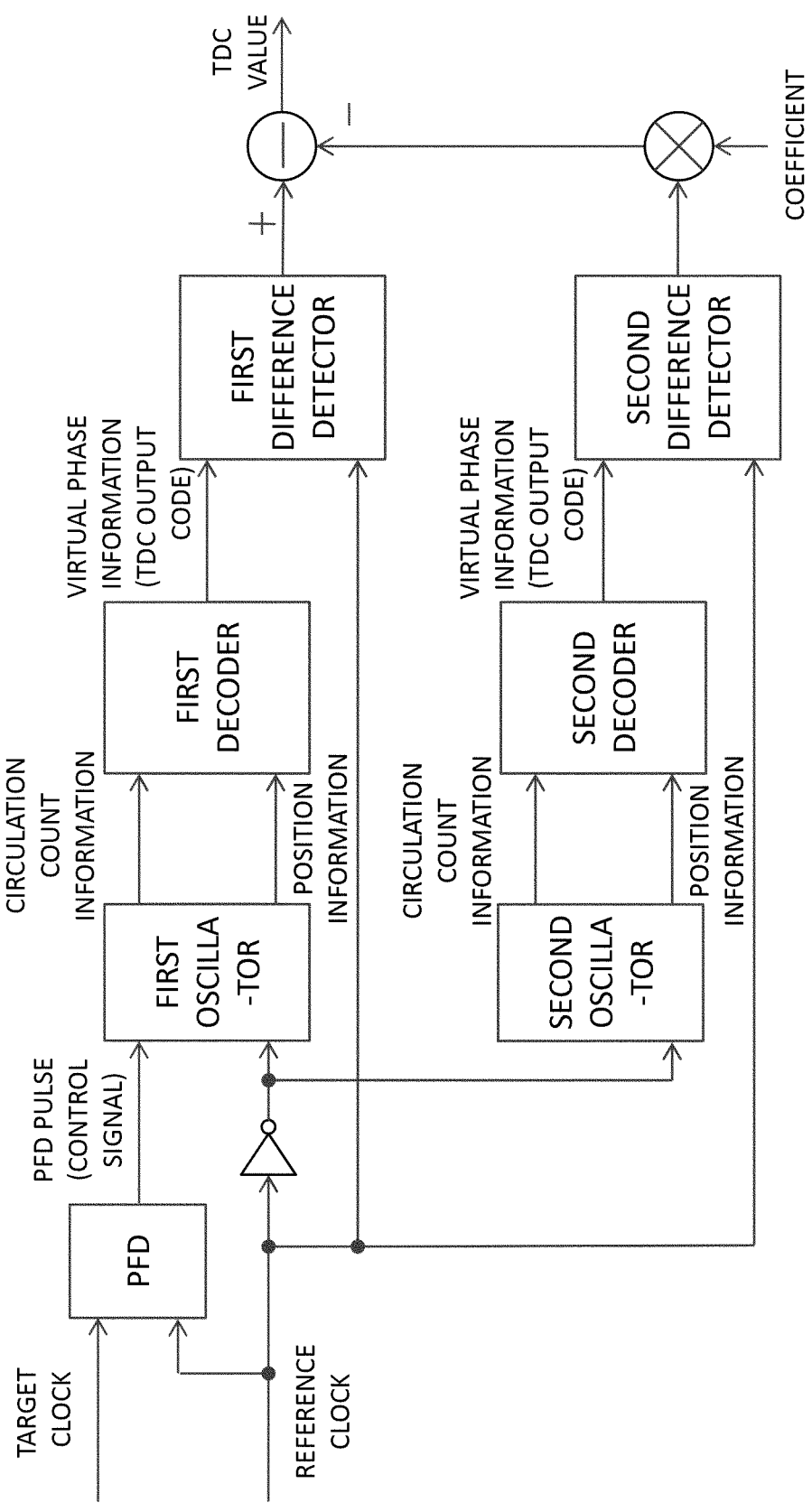
FIG. 15 illustrates another example configuration of the TDC in the Patent Literature 1.

FIG. 15 illustrates another example configuration of the TDC in the Patent Literature 1. The TDC illustrated in the present figure further includes, in addition to the TDC illustrated in FIG. 8, a second oscillator operating at a constant speed at all times, a second decoder, and a second difference detector. Then, the TDC value is obtained by subtracting, from an output of the first difference detector, an output of the second difference detector multiplied by a constant coefficient.

The TDC conversion in this configuration and an influence on a change in the power supply voltage are described by using the next figure.

Figure 16A:
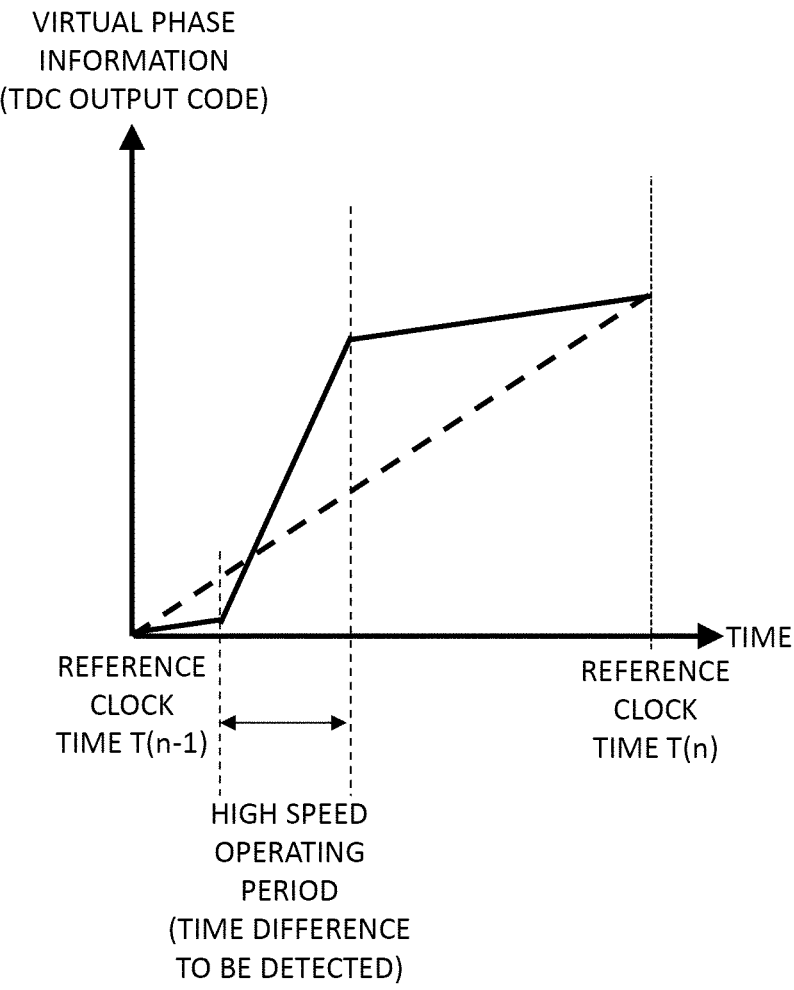
FIG. 16A illustrates a diagram which depicts the TDC conversion in another example configuration of the Patent Literature 1.
Figure 16B:
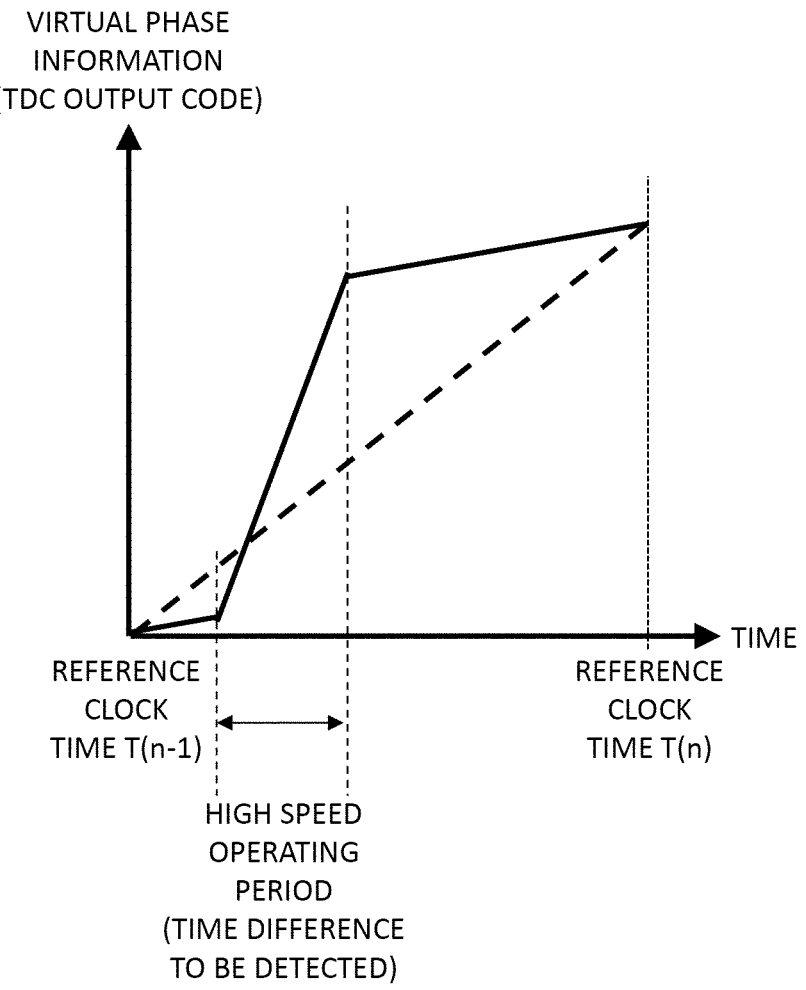
FIG. 16B illustrates a diagram which depicts the TDC conversion in another example configuration of the Patent Literature 1.

FIG. 16A and FIG. 16B each illustrates a diagram which depicts the TDC conversion in another example configuration of the Patent Literature 1. In the present figure, the vertical axis indicates virtual phase information and the horizontal axis indicates a time. In addition, in the present figure, a solid line indicates virtual phase information by the first oscillator and a dashed line indicates the virtual phase information by the second oscillator multiplied by a constant coefficient. In addition, FIG. 16A illustrates the case of a lower power supply voltage and FIG. 16B illustrates the case of a higher power supply voltage. As already described, a response of the first oscillator changes to a high speed in the high speed operation period corresponding to a period when the PFD pulse is High and changes to a low speed in the remaining periods. On the other hand, a value related to the second oscillator changes at a constant speed at all times. A difference between the virtual phase information of the first oscillator fetched at the reference clock and a value of the virtual phase information of the second oscillator multiplied by a constant coefficient is the TDC value. Here, the PLL is fed back such that this TDC value is 0, whereby the PFD pulse width is adjusted as appropriate and the PLL is locked. In this case, if a power supply voltage is higher, for example, the delay time of the delay element of the first oscillator is shorter and thus the virtual phase information which changes for one cycle is larger. However, the delay time of the delay element of the second oscillator is also shorter similarly and thus the virtual phase information which changes for one cycle in conjunction is also larger. As a result, the TDC value to be output does not change while the PLL is locked. That is, the PFD pulse width remains unchanged and a change in the power supply voltage is not converted to the phase noise when the PLL is locked, even if the power supply voltage changes. Therefore, for a gradual change in the power supply voltage, an influence on the phase noise can be suppressed. However, an abrupt change in the power supply voltage deteriorates the performance. A simulation result of a variance of the power supply voltage in this configuration is illustrated in the next figure.

Figure 17:
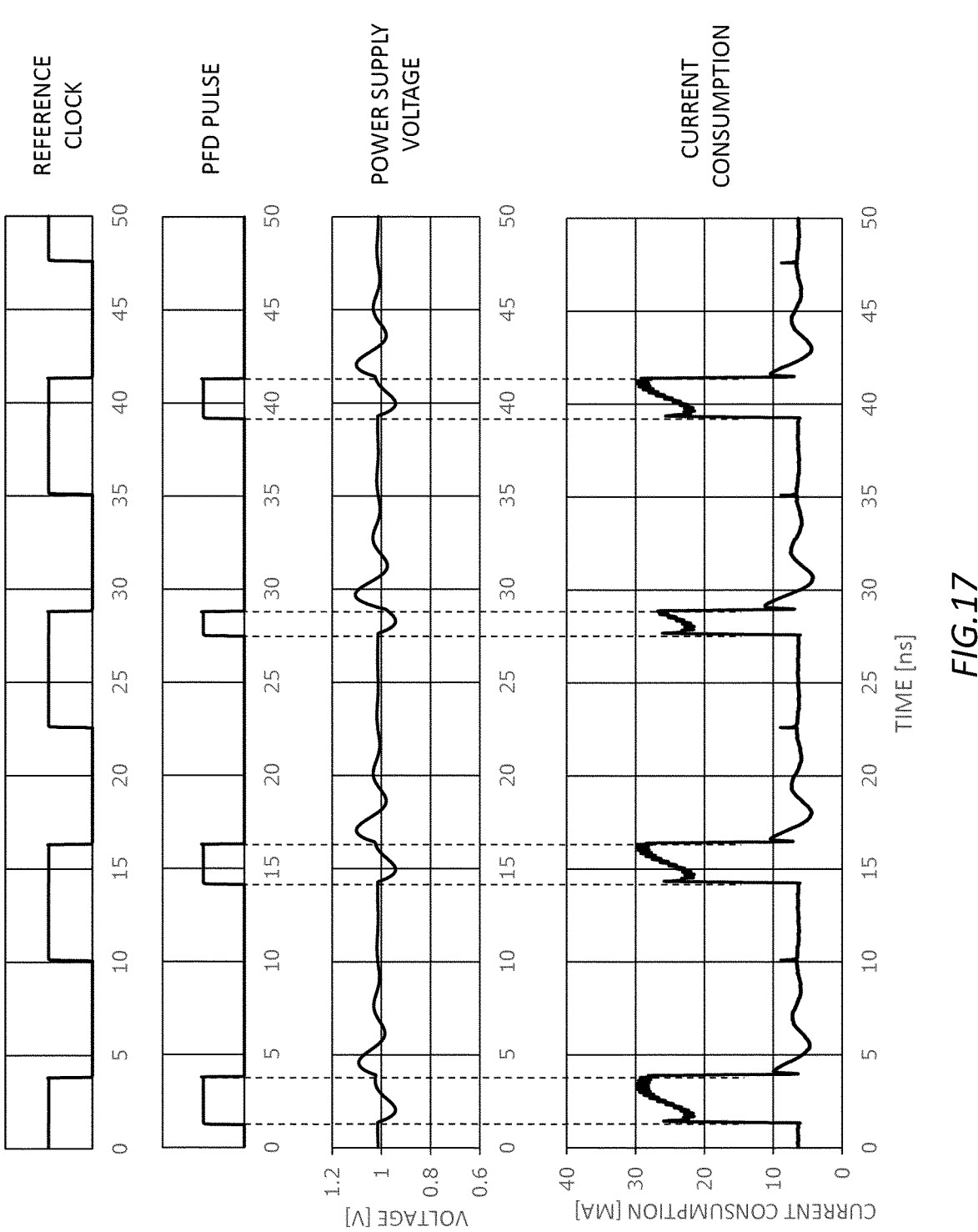
FIG. 17 illustrates a diagram which depicts a variance of the power supply voltage in another example configuration of the Patent Literature 1.

FIG. 17 illustrates a diagram which depicts a variance of the power supply voltage in another example configuration of the Patent Literature 1. In the present figure, the vertical axes indicate, from the top, a reference clock, a PFD pulse, a power supply voltage, and a current consumption, and the horizontal axis indicates a time. For obtaining the simulation result illustrated in the present figure, the ring oscillator is operate with while switching the delay time of the inverter to be a higher speed. In general, the current consumption of the ring oscillator is proportional to multiplication of the delay time and a capacity component of an input of each inverter, and a shorter delay time, that is, an operation at a higher speed, increases a current consumption. Therefore, switching the operation of the ring oscillator between the high speed operating mode and the low speed operating mode by way of the PFD pulse largely varies a current consumption of the ring oscillator. The graph at the bottom of the present figure illustrates a current consumption of the ring oscillator, from which it is appreciated that a current consumption largely increases while the PFD pulse is High, that is, in the high speed operation period, and the current consumption largely decreases in the remaining periods. In the actual circuit, a power supply contains a finite impedance such as a parasitic resistance component and an inductance component, different from an ideal power supply. Therefore, a sudden change in the current consumption varies the power supply voltage at a high speed. In this case, if a width of the PFD pulse is short, the operating mode is transited to the next before this change in the power supply voltage does not converge. While the power supply voltage is changing, as a matter of course, the delay time of the delay element is changing every moment in accordance with the power supply voltage so that the delay time is not kept constant. Therefore, in the case where the operating mode is transited to the next before the change in the power supply voltage does not converge, for a variance of the power supply voltage depending on the width of the PFD pulse, an influence on a change in the delay time varies to cause an error of the TDC value. This error results in the phase noise, preventing reduction of the noise of the PLL. That is, there is an issue that the configuration as disclosed in the Patent Literature 1 is vulnerable to a change in the power supply voltage at a high speed caused by a change in the current itself so that an error caused by the change in the power supply voltage deteriorates the noise performance.

The similar issue can be seen in the Patent Literature 2. In the Patent Literature 2, a switching noise can be reduced by making an amount of currents changing during the gating operation of the oscillator (corresponding to the period when the PFD pulse is High, in the foregoing description) smaller. However, it is basically similar to the Patent Literature 1 in an influence by the switching noise.

Then, in view of such a situation, in each embodiment described below, it is the objective to provide a TDC having a good noise performance by suppressing a switching noise of the power supply generated during the gating operation.

Figure 18:
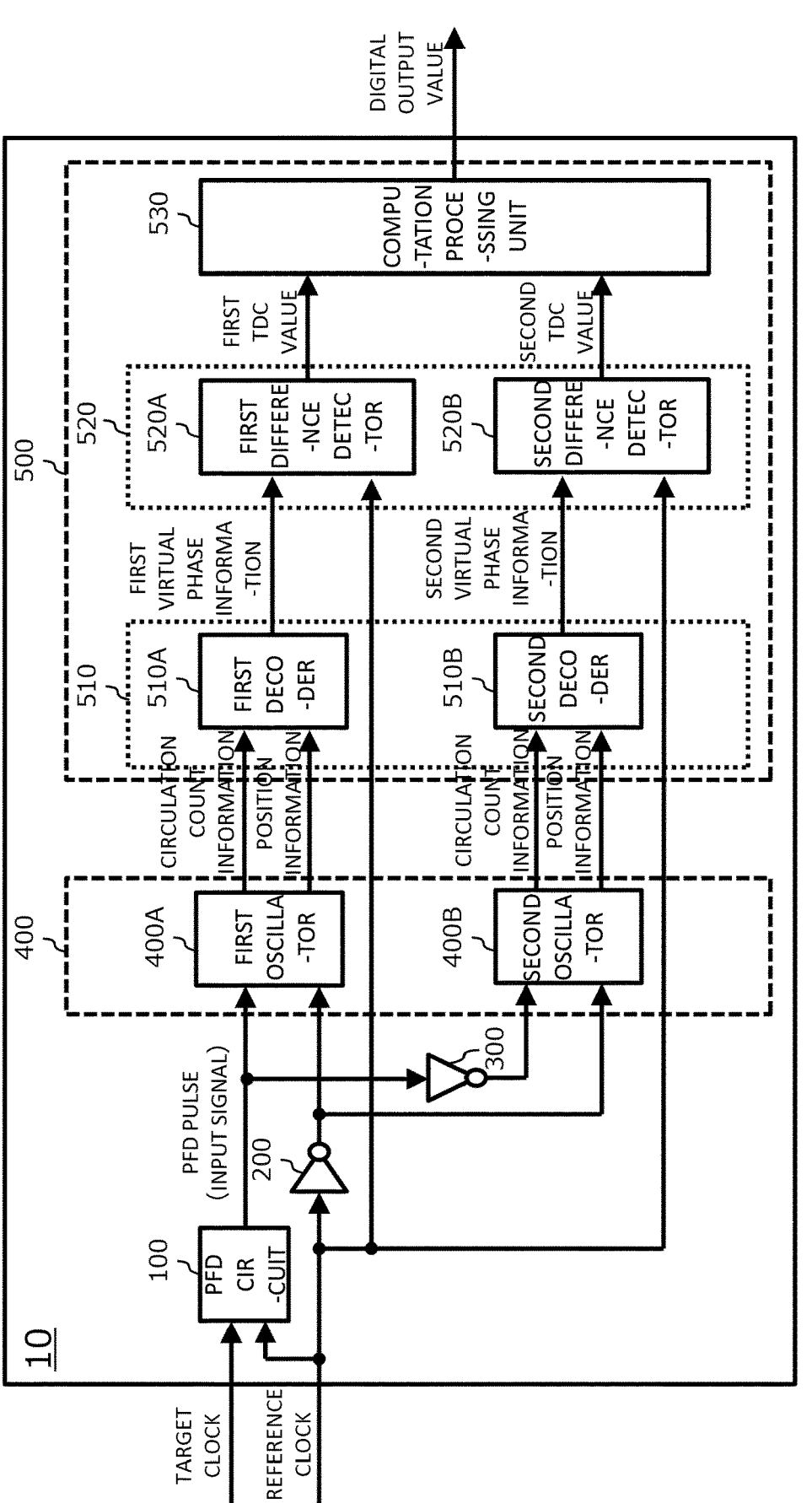
FIG. 18 illustrates an example configuration of the TD converter 10 according to the first embodiment.

FIG. 18 illustrates an example configuration of the TD converter 10 according to the first embodiment. The TD converter 10 converts a time difference between the reference clock and the target clock to a digital output value, by using a plurality of pieces of phase information retained in a plurality of oscillators, respectively. In this case, the TD converter 10 operates at least two oscillators of the plurality of oscillators in operating modes with oscillation frequencies different from each other, in accordance with an input signal indicating the time difference. Here, such an input signal may be a pulse signal having a pulse width depending on a time difference between the reference clock and the target clock.

The TD converter 10 includes a PFD circuit 100, a first NOT circuit 200, a second NOT circuit 300, a plurality of oscillators 400, and a computation circuit 500.

The PFD circuit 100 receives a reference clock used as a reference and a target clock used as a target from which a time difference to the reference clock is to be detected, which are input thereto. Note that when the TD converter 10 is used in the PLL circuit, a divided clock which is a feedback clock may be used as the "target clock". The PFD circuit 100 generates and outputs a PFD pulse which is a pulse signal having a pulse width depending on a time difference between the reference clock and the target clock.

The first NOT circuit 200 receives the reference clock input thereto. The first NOT circuit 200 performs an NOT operation to output a signal having an inverted polarity with respect to the reference clock.

The second NOT circuit 300 receives the PFD pulse input thereto. The second NOT circuit 300 performs an NOT operation to output a signal having an inverted polarity with respect to the PFD pulse.

The plurality of oscillators 400 at least include a first oscillator 400A and a second oscillator 400B. In the present embodiment, provided is one example where the plurality of oscillators 400 only includes two oscillators, the first oscillator 400A and the second oscillator 400B. However, the plurality of oscillators 400 may also include one or more other oscillators, in addition to the first oscillator 400A and the second oscillator 400B. Here, unless particularly required to be distinguished, the first oscillator 400A, the second oscillator 400B, and other oscillators are collectively referred to as the oscillators 400. It is desired that all of the oscillators 400 have the same circuit configuration and the same circuit arrangement to exhibit the same electrical characteristics as far as possible.

Each of the first oscillator 400A and the second oscillator 400B is configured to be operable in at least two operating modes, a high speed operating mode and a low speed operating mode with an oscillation frequency lower than that of the high speed operating mode, and may be configured to be able to switch the two operating modes in response to a control signal. In this case, the first oscillator 400A uses the PFD pulse as a control signal to switch the operating mode while the second oscillator 400B may use a signal having an inverted polarity with respect to the PFD pulse as a control signal to switch the operating mode.

In more detail, the first oscillator 400A may receive an output of the PFD circuit 100 (that is, the PFD pulse) and an output of the first NOT circuit 200 (that is, a signal having an inverted polarity with respect to the reference clock) input thereto. Then, the first oscillator 400A may switch between the high speed operating mode and the low speed operating mode, depending on a value of the PFD pulse. On the other hand, the second oscillator 400B may receive an output of the second NOT circuit 300 (that is, a signal having an inverted polarity with respect to the PFD pulse) and an output of the first NOT circuit 200 input thereto. Then, the second oscillator 400B may switch the high speed operating mode and the low speed operating mode, depending on a value of the signal having an inverted polarity with respect to the PFD pulse. This may allow the second oscillator 400B to operate in the low speed operating mode when the first oscillator 400A operates in the high speed operating mode, and allow the second oscillator 400B to operate in the high speed operating mode when the first oscillator 400A operates in the low speed operating mode. The first oscillator 400A and the second oscillator 400B can operate in the operating modes with the oscillation frequencies different from each other in accordance with an input signal (PFD pulse) indicating a time difference between a reference clock and a target clock in this manner, for example.

The oscillator 400 retains phase information according to the reference clock (a signal having an inverted polarity with respect to the reference clock in the present figure). Here, if the oscillator 400 includes a ring oscillator formed by delay elements cascaded in a ring shape, such phase information may include circulation count information indicating a circulation count of the ring oscillator, and position information indicating a position of the delay element at which a logic level of an input is equal to a logic level of an output.

The computation circuit 500 calculates a digital output value depending on a time difference between the reference clock and the target clock by using a plurality of pieces of phase information retained according to the reference clock in the plurality of oscillators 400, respectively. Here, each piece of the plurality of pieces of phase information may include, as described above, circulation count information which indicates a circulation count of the ring oscillator, and position information which indicates a position of the delay element at which a logic level of an input is equal to a logic level of an output.

The computation circuit 500 may include a plurality of decoders 510, a plurality of difference detectors 520, and a computation processing unit 530.

The plurality of decoders 510 may calculate, for the plurality of pieces of phase information, virtual phase information indicating information of a virtual phase by using circulation count information and position information, respectively. In the present embodiment, provided is one example where the plurality of decoders 510 only include the first decoder 510A and the second decoder 510B. However, the plurality of decoders 510 may include, instead of or in addition to the first decoder 510A and the second decoder 510B, one or more other decoders. Here, unless particularly required to be distinguished, the first decoder 510A, the second decoder 510B, and other decoders are collectively referred to as the decoder 510.

The decoder 510 may compute the circulation count information×the number of stages N+the phase information to calculate virtual phase information which is a TDC output code, where N is the number of stages of the delay element configuring the ring oscillator included in the corresponding oscillator 400. The first decoder 510A may calculate first virtual phase information by using the circulation count information and the position information included in the phase information retained by the first oscillator 400A. Similarly, the second decoder 510B may calculate second virtual phase information by using the circulation count information and the position information included in the phase information retained by the second oscillator 400B.

The plurality of difference detectors 520 may receive a plurality of pieces of virtual phase information input thereto which are calculated by the plurality of decoders 510, respectively, and detect a TDC value indicating a difference between the input virtual phase information and the virtual phase information at the time when the reference clock is one clock earlier, respectively. In the present embodiment, provided is one example where the plurality of difference detectors 520 only include the first difference detector 520A and the second difference detector 520B. However, the plurality of difference detectors 520 may also include, instead of or in addition to the first difference detector 520A and the second difference detector 520B, one or more other difference detectors. Here, unless particularly required to be distinguished, the first difference detector 520A, the second difference detector 520B, and other difference detectors are collectively referred to as the difference detector 520.

The difference detector 520 may be configured with a first DFF which retains virtual phase information at the time when the reference clock is one clock earlier, a subtractor which computes a difference between the virtual phase information and an output of the first DFF input thereto, and an overflow operation unit, as illustrated in FIG. 10. Instead, the difference detector 520 may also be configured with, a first DFF which fetches virtual position information to retain virtual phase information at the time when the reference clock is one clock earlier, a second DFF which fetches an output of the first DFF to retain virtual phase information at the time when the reference clock is two clocks earlier, a subtractor which computes a difference between an output of the first DFF and an output second DFF, and an overflow operation unit, as illustrated in FIG. 11. The first difference detector 520A may receive the first virtual phase information calculated by the first decoder 510A and the reference clock input thereto. Then, the first difference detector 520A may detect a first TDC value indicating a difference between the input first virtual phase information and the first virtual phase information at the time when the reference clock is one clock earlier. Similarly, the second difference detector 520B may receive the second virtual phase information calculated by the second decoder 510B and the reference clock input thereto. Then, the second difference detector 520B may detect a second TDC value indicating a difference between the input second virtual phase information and the second virtual phase information at the time when the reference clock is one clock earlier.

The computation processing unit 530 may calculate a digital output value depending on a time difference between the reference clock and the target clock based on a plurality of TDC values detected by the plurality of difference detectors 520. In the present embodiment, the computation processing unit 530 may calculate a digital output value depending on a time difference between the reference clock and the target clock, based on the first TDC value detected by the first difference detector 520A and the second TDC value detected by the second difference detector 520B. Details of the computation processing unit 530 will be described below.

Figure 19:
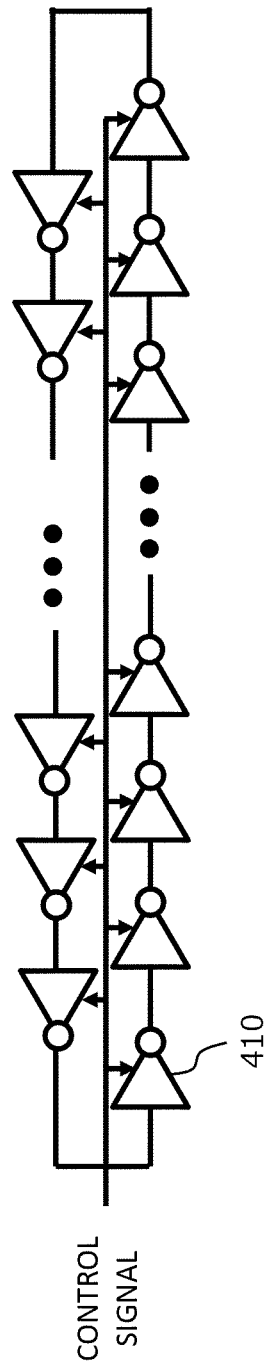
FIG. 19 illustrates an example configuration of a ring oscillator which may be included in the oscillator 400.

FIG. 19 illustrates an example configuration of a ring oscillator which may be included in the oscillator 400. In the ring oscillator, an inverter may be used as the delay element 410. Then, such delay elements 410 may be cascaded in a ring shape. Each delay element 410 may receive a control signal input thereto, respectively, to control the operating mode. The delay element 410 may be a circuit to switch the delay time by this control signal. For example, the delay element 410 may be able to switch the delay time such that the delay time is shorter when the control signal is High and the delay time is longer when the control signal is Low.

Each of the plurality of oscillators 400 may include a ring oscillator formed by the delay elements 410 cascaded in a ring shape in this manner. Here, as described above, the first oscillator 400A may use the PFD pulse as a control signal. Therefore, the first oscillator 400A may operate in the high speed operating mode by switching such that the delay time of the delay element 410 is shorter when the PFD pulse is High. In addition, the first oscillator 400A may operate in the low speed operating mode by switching such that the delay time of the delay element 410 is longer when the PFD pulse is Low. On the other hand, the second oscillator 400B may use a signal having an inverted polarity with respect to the PFD pulse as a control signal. Therefore, the second oscillator 400B may operate in the low speed operating mode by switching such that the delay time of the delay element 410 is longer when the PFD pulse is High. In addition, the second oscillator 400B may operate in the high speed operating mode by switching such that the delay time of the delay element 410 is shorter when the PFD pulse is Low. Each of the first oscillator 400A and the second oscillator 400B may be configured to be able to switch the operating mode by switching the delay time in the delay element 410 in accordance with the input signal (PFD pulse) in this manner, for example.

Note that, although the illustration is omitted herein, each of the plurality of oscillators 400 may include a latch circuit retaining an output value of the each delay element 410 at the timing of the reference clock (a signal having an inverted polarity with respect to the reference clock, in the present embodiment), and a circulation counter counting a circulation count of the ring oscillator, as illustrated in FIG. 9.

Figure 20:
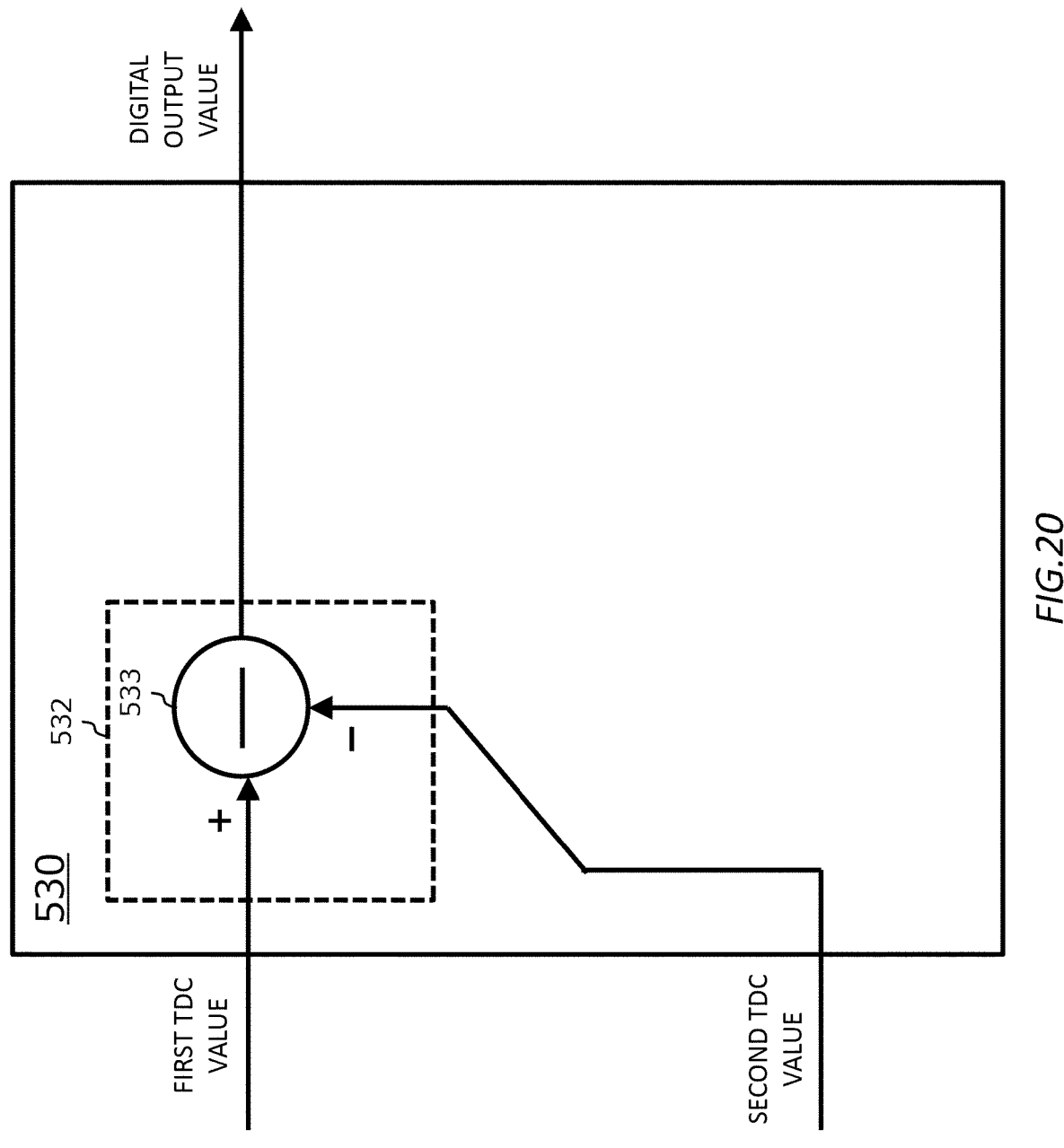
FIG. 20 illustrates the first example configuration of the computation processing unit 530.

FIG. 20 illustrates the first example configuration of the computation processing unit 530. The computation processing unit 530 according to the first example configuration may include a dependent value extracting unit 532. The dependent value extracting unit 532 may extract from each of the plurality of TDC values, a dependent value indicating a value which changes depending on a time difference between the reference clock and the target clock. In more detail, the dependent value extracting unit 532 may be configured with a first subtractor 533. The first subtractor 533 may compute a difference between a second TDC value and a first TDC value of the plurality of TDC values. The dependent value extracting unit 532 may extract as a dependent value, the difference between the first TDC value and the second TDC value, computed by the first subtractor 533. In the first example configuration, the dependent value extracting unit 532 may output the dependent value extracted in this manner as a digital output value. This is described in detail by using the graph.

Figure 21:
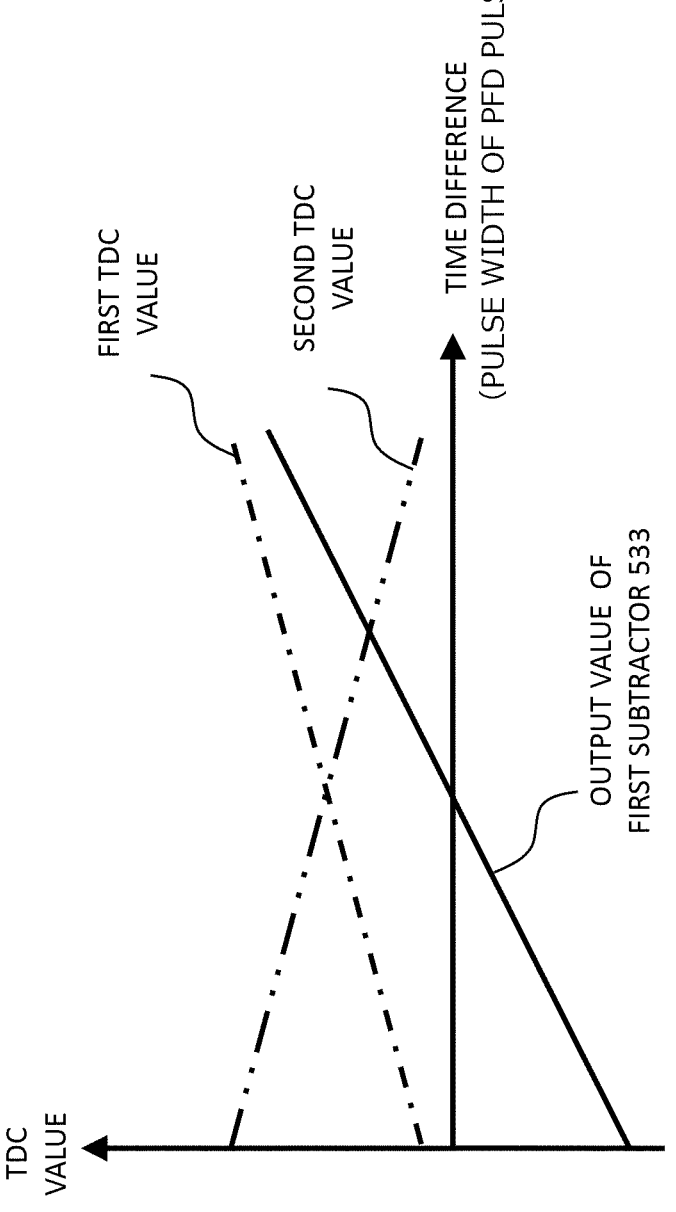
FIG. 21 illustrates situations of computation by the computation processing unit 530 according to the first example configuration.

FIG. 21 illustrates situations of computation by the computation processing unit 530 according to the first example configuration. In the present figure, the vertical axis indicates a TDC value, and the horizontal axis indicates a time difference between the reference clock and the target clock, that is, a pulse width of the PFD pulse. In addition, in the present figure, the one-dot chain line indicates a first TDC value, the double-dot dashed line indicates a second TDC value, and the solid line indicates an output value of the first subtractor 533.

The first TDC value increases when the pulse width of the PFD pulse is longer so that the ratio of time increases for one cycle when the first oscillator 400A operates in the high speed operating mode. Therefore, the first TDC value has a positive gradient. On the other hand, the second TDC value decreases when the pulse width of the PFD pulse is longer so that the ratio of time increases for one cycle when the second oscillator 400B operates in the low speed operating mode. Therefore, the second TDC value has a negative gradient.

Therefore, an output value of the first subtractor 533 computing a difference between the first TDC value and the second TDC value provides a response which further largely changes in accordance with the pulse width of the PFD pulse. In this example subtracting the second TDC value from the first TDC value, the response has a positive gradient. In this manner, the first subtractor 533 provides a functionality of the dependent value extracting unit 532 extracting from each TDC value, a dependent value indicating a value varying depending on the pulse width of the PFD pulse, that is, a time difference information extracting unit. In the first example configuration, the dependent value extracting unit 532 may output as a digital output value, a dependent value indicating a time difference information extracted in this manner, for example.

Figure 22:
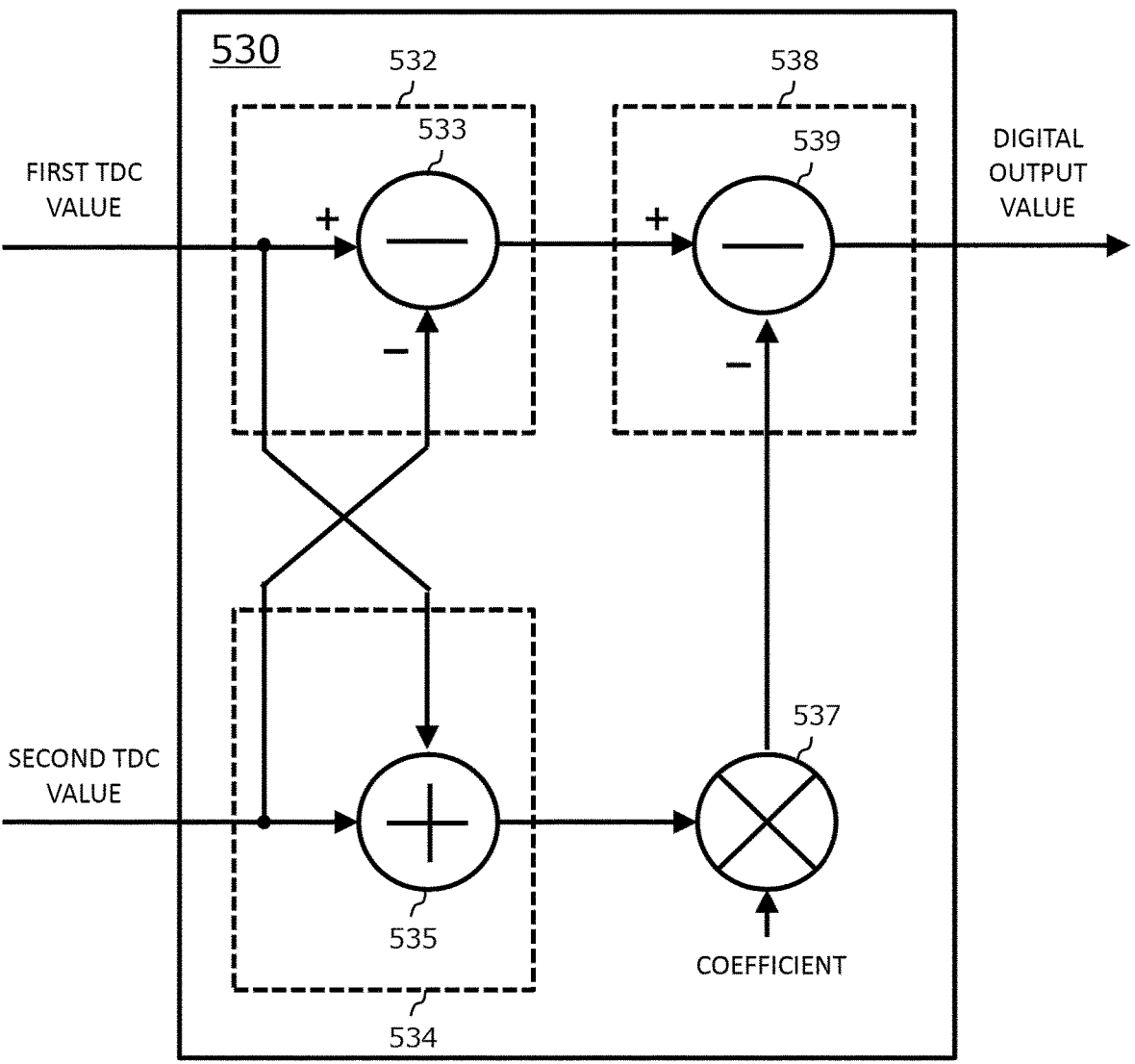
FIG. 22 illustrates the second example configuration of the computation processing unit 530.

FIG. 22 illustrates the second example configuration of the computation processing unit 530. In the present figure, components having the same function and configuration as in FIG. 20 are given the same reference numerals, and the following describes only differing points. The computation processing unit 530 according to the second example configuration may further include an independent value extracting unit 534, a multiplier 537, and a difference output unit 538, in addition to the functional units included in the computation processing unit 530 according to the first example configuration.

The independent value extracting unit 534 may extract from each of the plurality of TDC values, an independent value indicating a value independent of a time difference between the reference clock and the target clock. In more detail, the independent value extracting unit 534 may be configured with an adder 535. The adder 535 may compute a sum of a second TDC value and a first TDC value of the plurality of TDC values. The independent value extracting unit 534 may extract as an independent value, a sum of the first TDC value and the second TDC value computed by the adder 535.

The multiplier 537 may multiply the independent value extracted by the independent value extracting unit 534 by a predetermined coefficient.

The difference output unit 538 may compute a difference between the dependent value extracted by the dependent value extracting unit 532 and the independent value extracted by the independent value extracting unit 534, and output the difference as a digital output value. In more detail, the difference output unit 538 may be configured with a second subtractor 539. The second subtractor 539 may compute a difference between the dependent value extracted by the dependent value extracting unit 532 and the independent value extracted by the independent value extracting unit 534 and multiplied by the coefficient by the multiplier 537. The difference output unit 538 may output the difference computed by the second subtractor 539 as a digital value. This is described in detail by using the graph.

Figure 23:
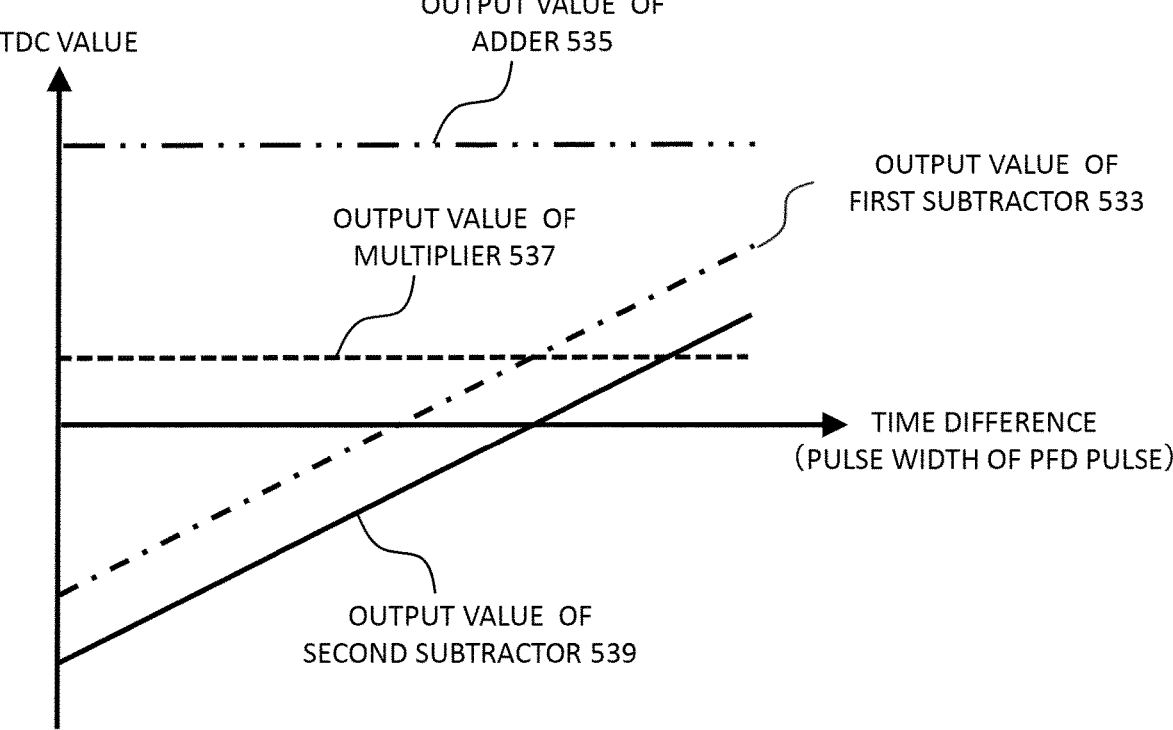
FIG. 23 illustrates situations of computation by the computation processing unit 530 according to the second example configuration.

FIG. 23 illustrates situations of computation by the computation processing unit 530 according to the second example configuration. In the present figure, the vertical axis indicates a TDC value, and the horizontal axis indicates a time difference between the reference clock and the target clock, that is, a pulse width of the PFD pulse. In addition, in the present figure, the one-dot chain line indicates an output value of the first subtractor 533, the double-dot dashed line indicates an output value of the adder 535, the dotted line indicates an output value of the multiplier 537, and the solid line indicates an output value of the second subtractor 539.

The first oscillator 400A and the second oscillator 400B use the same circuit configuration and the same circuit arrangement to exhibit almost the same electrical characteristics. Therefore, an absolute value of the gradient of the first TDC value and an absolute value of the gradient of the second TDC value are almost the same. Therefore, an output of the adder 535 computing a sum of the first TDC value and the second TDC value provides a functionality of the independent value extracting unit 534 extracting an independent value indicating a value independent of the pulse width of the PFD pulse. The multiplier 537 may multiply an output of the adder 535 which is a value substantially constant with respect to the pulse width in this manner by a predetermined appropriate coefficient. Then, the second subtractor 539 may compute a difference between an output of the first subtractor 533 and an output of the multiplier 537 to obtain a final digital output value.

The computation processing unit 530 according to the second example configuration can control a zero cross point of the TDC output with a coefficient in the multiplier 537 in this manner, for example. Therefore, the PLL circuit using such a TD converter 10 can control a phase state to lock the PLL. In addition, if the power supply voltage decreases or increases at a speed sufficiently slower than the cycle of the reference clock, operation speeds of the first oscillator 400A and the second oscillator 400B decrease or increase at the same ratio so that an output value of the first subtractor 533 and an output value of the adder 535 decrease or increase at the same ratio. This maintains the zero cross point of the digital output value finally obtained unchanged so that the power supply does not change the phase difference at which the PLL circuit transits to the locked state.

Note that the PLL circuit of a type called an Fractional-N PLL in general dynamically varies the number of divisions in the divider of FIG. 2 to implement the number of divisions after the decimal point on average. Therefore, a difference between the phase of the reference clock and the phase of the divided clock repeatedly decreases or increases over time and results in a constant phase difference on average. That is, the pulse width of the PFD pulse has a width of variance to some extent. The PFD circuit operates stably within a predetermined range of a phase difference, in general, and provides a discontinuous response when the pulse width of the PFD pulse is zero or the maximum width, for example. Therefore, it is required to avoid such a region to implement a stable operation of the PLL.

The phase difference at which the digital output value is a zero cross point is a phase difference which is an average value of the pulse width of the PFD pulse. Therefore, a coefficient given to the multiplier 537 is required to be determined such that the PFD circuit stably operates, taking into account a width of variance of the PFD pulse applicable when operating as an Fractional-N PLL. Note that a coefficient given to the multiplier 537 may be a predetermined design value such that the PLL circuit stably operates. As far as the PLL circuit stably operates, selection of this coefficient does not directly affect the effect of the TD converter 10.

Figure 24:
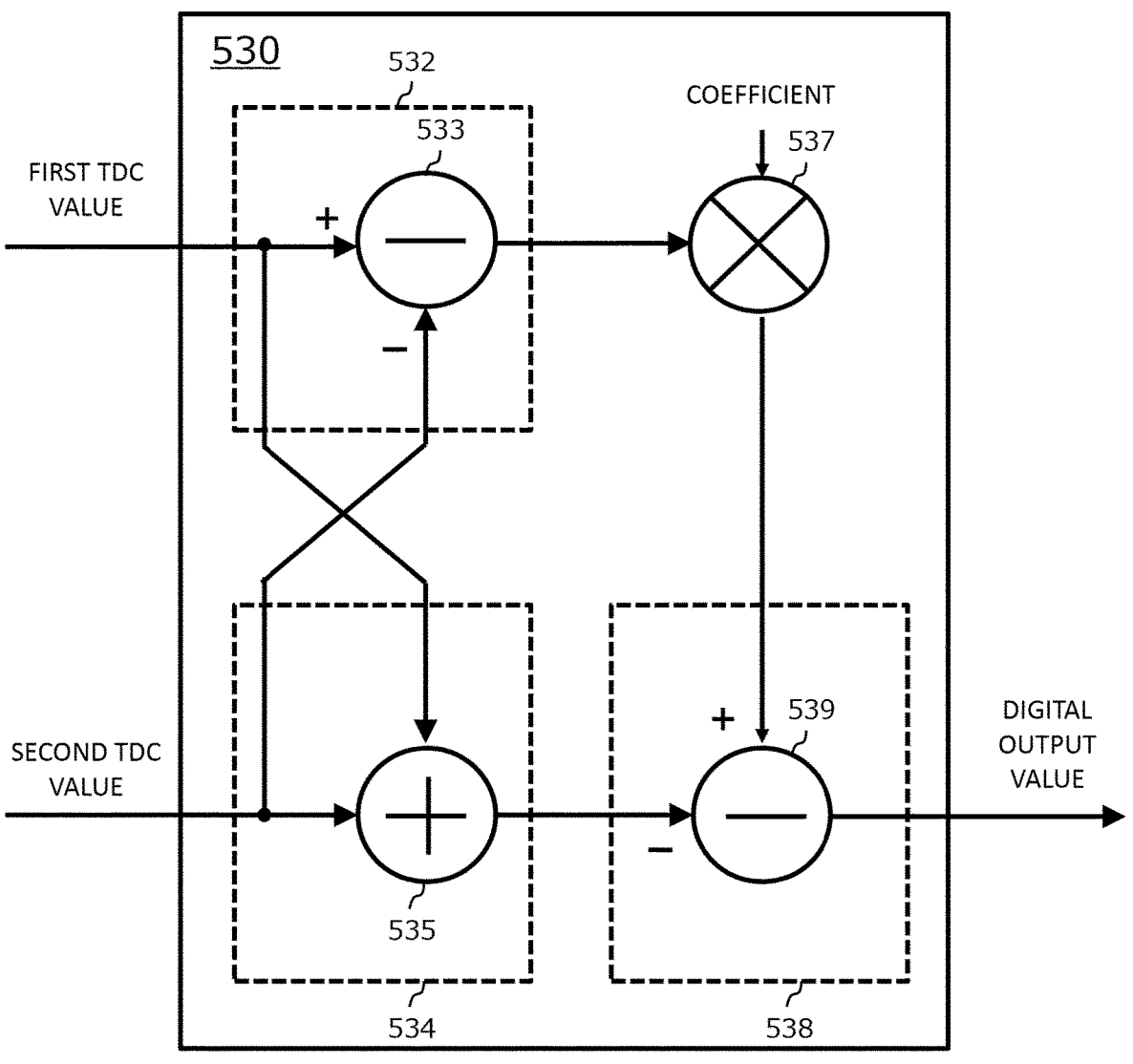
FIG. 24 illustrates the third example configuration of the computation processing unit 530.

FIG. 24 illustrates the third example configuration of the computation processing unit 530. In the present figure, components having the same function and configuration as in FIG. 22 are given the same reference numerals, and the following describes only differing points. The computation processing unit 530 according to the second example configuration inputs an output of the adder 535 to the multiplier 537 and outputs a difference between an output of the multiplier 537 and an output of the first subtractor 533 calculated at the second subtractor 539 as a digital output value. The computation processing unit 530 according to the third example configuration may input an output of the first subtractor 533 to the multiplier 537 and output a difference between an output of the multiplier 537 and an output of the adder 535 at the second subtractor 539 as a digital output value.

Figure 25:
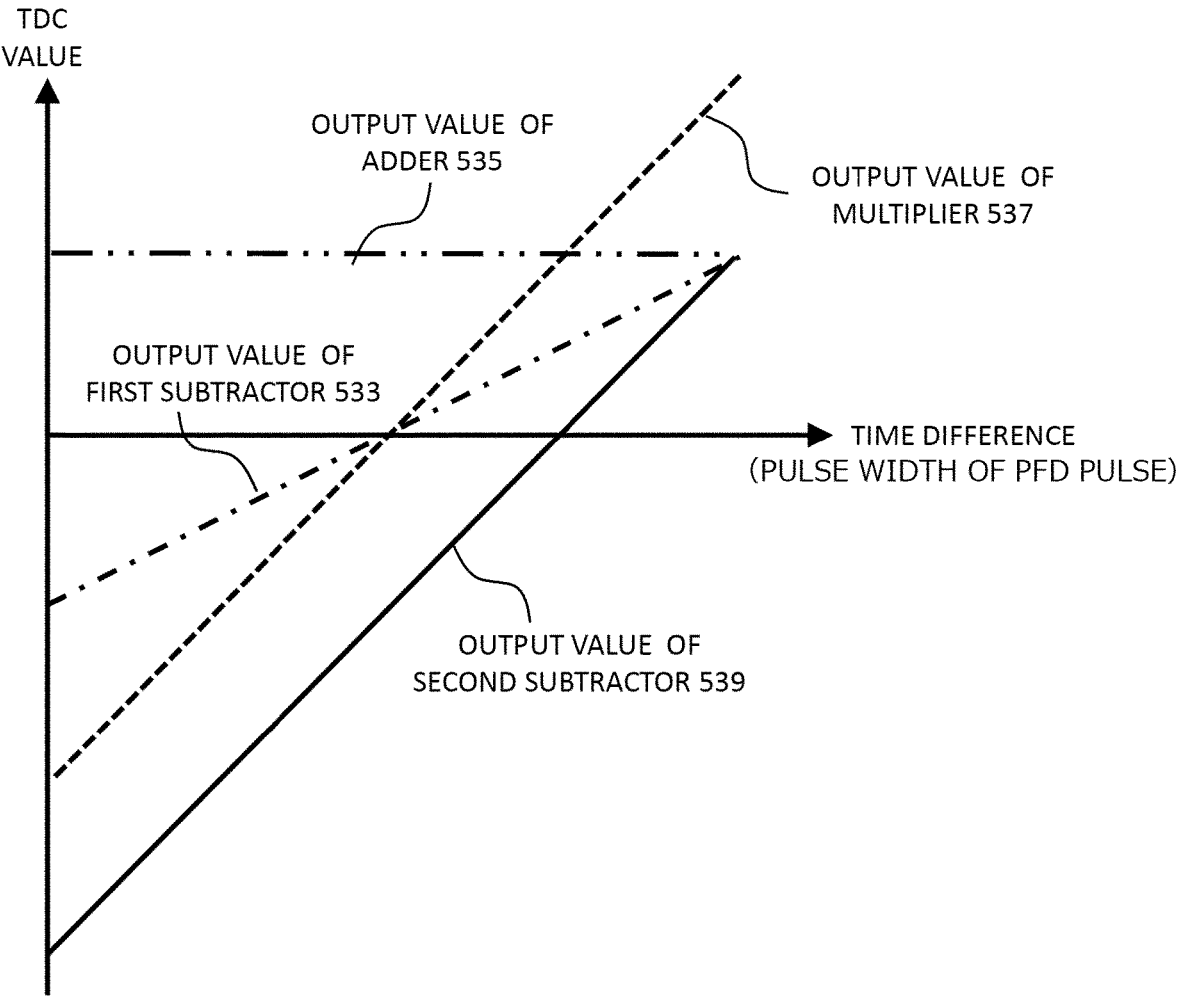
FIG. 25 illustrates situations of computation by the computation processing unit 530 according to the third example configuration.

FIG. 25 illustrates situations of computation by the computation processing unit 530 according to the third example configuration. In the present figure, the vertical axis indicates a TDC value, and the horizontal axis indicates a time difference between the reference clock and the target clock, that is, a pulse width of the PFD pulse. In addition, in the present figure, the one-dot chain line indicates an output value of the first subtractor 533, the double-dot dashed line indicates an output value of the adder 535, the dotted line indicates an output value of the multiplier 537, and the solid line indicates an output value of the second subtractor 539.

In the computation processing unit 530 according to the third example configuration, the multiplier 537 may multiply an output of the first subtractor 533 providing a response having a positive gradient with respect to the pulse width of the PFD pulse by a predetermined appropriate coefficient. Then, the second subtractor 539 may compute a difference between an output of the multiplier 537 and an output of the adder 535 to obtain a final digital output value. That is, instead of multiply the independent value extracted by the independent value extracting unit 534 by a predetermined coefficient, the multiplier 537 may also multiply the dependent value extracted by the dependent value extracting unit 532 by a predetermined coefficient. Therefore, the computation processing unit 530 can further include the multiplier 537 multiplying the dependent value or the independent value by a predetermined coefficient, similarly to the second example configuration or the third example configuration.

Similarly to the second example configuration, the computation processing unit 530 according to the third example configuration can control a zero cross point of the TDC output with a coefficient in the multiplier 537 in this manner, for example. Therefore, the PLL circuit using such a TD converter 10 can control a phase state to lock the PLL. In addition, if the power supply voltage decreases or increases at a speed sufficiently slower than the cycle of the reference clock, operation speeds of the first oscillator 400A and the second oscillator 400B decrease or increase at the same ratio so that an output value of the first subtractor 533 and an output value of the adder 535 decrease or increase at the same ratio. This maintains the zero cross point of the digital output value finally obtained unchanged so that the power supply does not change the phase difference at which the PLL circuit transits to the locked state. In this manner, the TD converter 10 using the computation processing unit 530 according to the third example configuration can obtain an effect similar to the one using the computation processing unit 530 according to the second example configuration.

Figure 26:
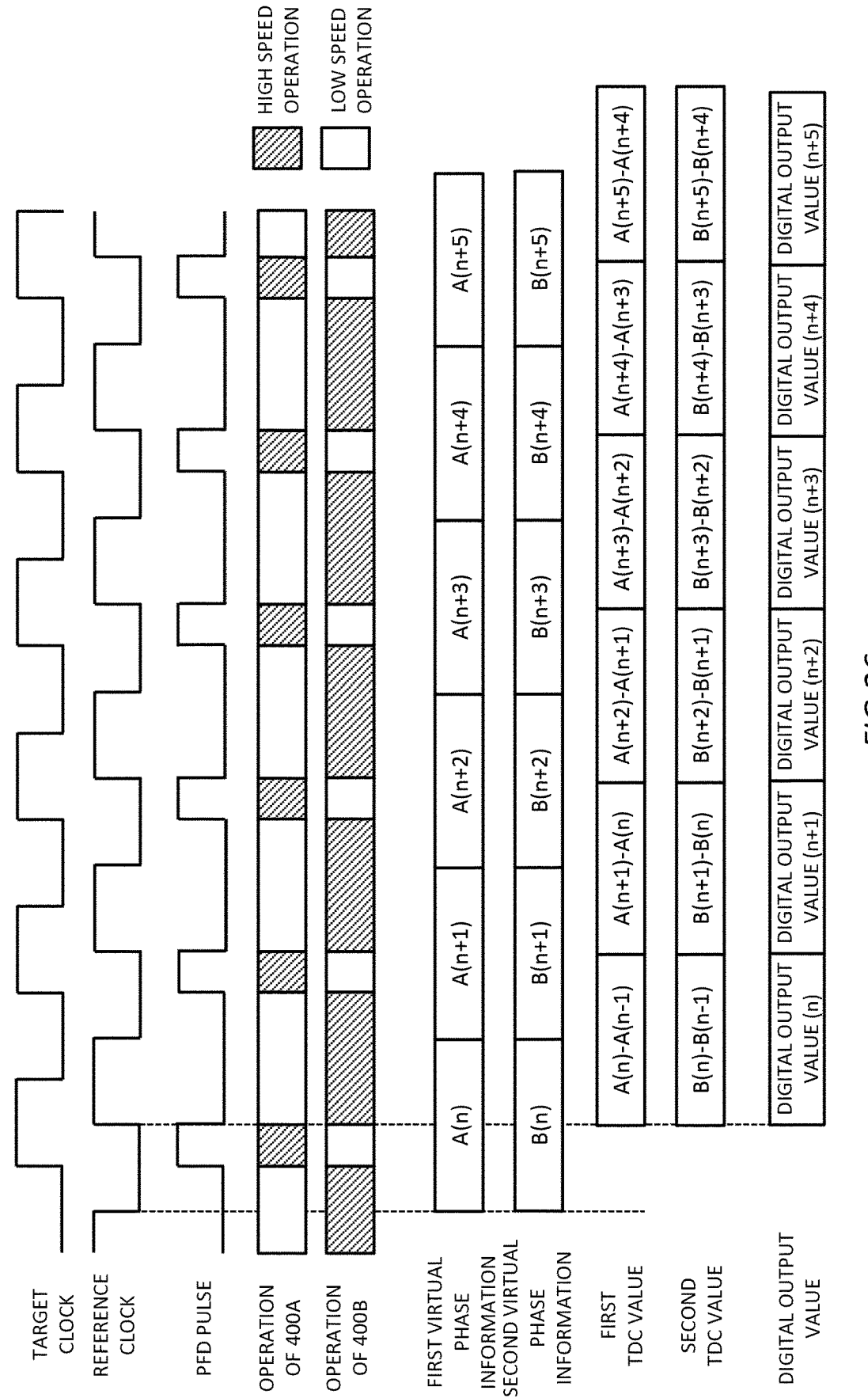
FIG. 26 illustrates an example of a timing chart of the TD converter 10 according to the first embodiment.

FIG. 26 illustrates an example of a timing chart of the TD converter 10 according to the first embodiment. In the present figure, the vertical axis indicates, from the top, the target clock, the reference clock, the PFD pulse, the operating mode of the first oscillator 400A, the operating mode of the second oscillator 400B, the first virtual phase information, the second virtual phase information, the first TDC value, the second TDC value, and the digital output value, and the horizontal axis indicates a time.

As illustrated in the present figure, the PFD pulse is generated at the timings of a rise of the target clock and a rise of the reference clock. Then, during such a period when the PFD pulse is High, the first oscillator 400A operates in the high speed operating mode and the second oscillator 400B operates in the low speed operating mode. On the other hand, during a period when the PFD pulse is Low, the first oscillator 400A operates in the low speed operating mode and the second oscillator 400B operates in the high speed operating mode.

Then, at the timing of the trail of the reference clock, the first virtual phase information (that is, an output of the first decoder 510A) and the second virtual phase information (that is, an output of the second decoder 510B) are updated. In addition, at the timing of the rise of the reference clock, the first TDC value (that is, an output of the first difference detector 520A) and the second TDC value (that is, an output of the second difference detector 520B) are updated, and the digital output value is also update correspondingly.

Figure 27:
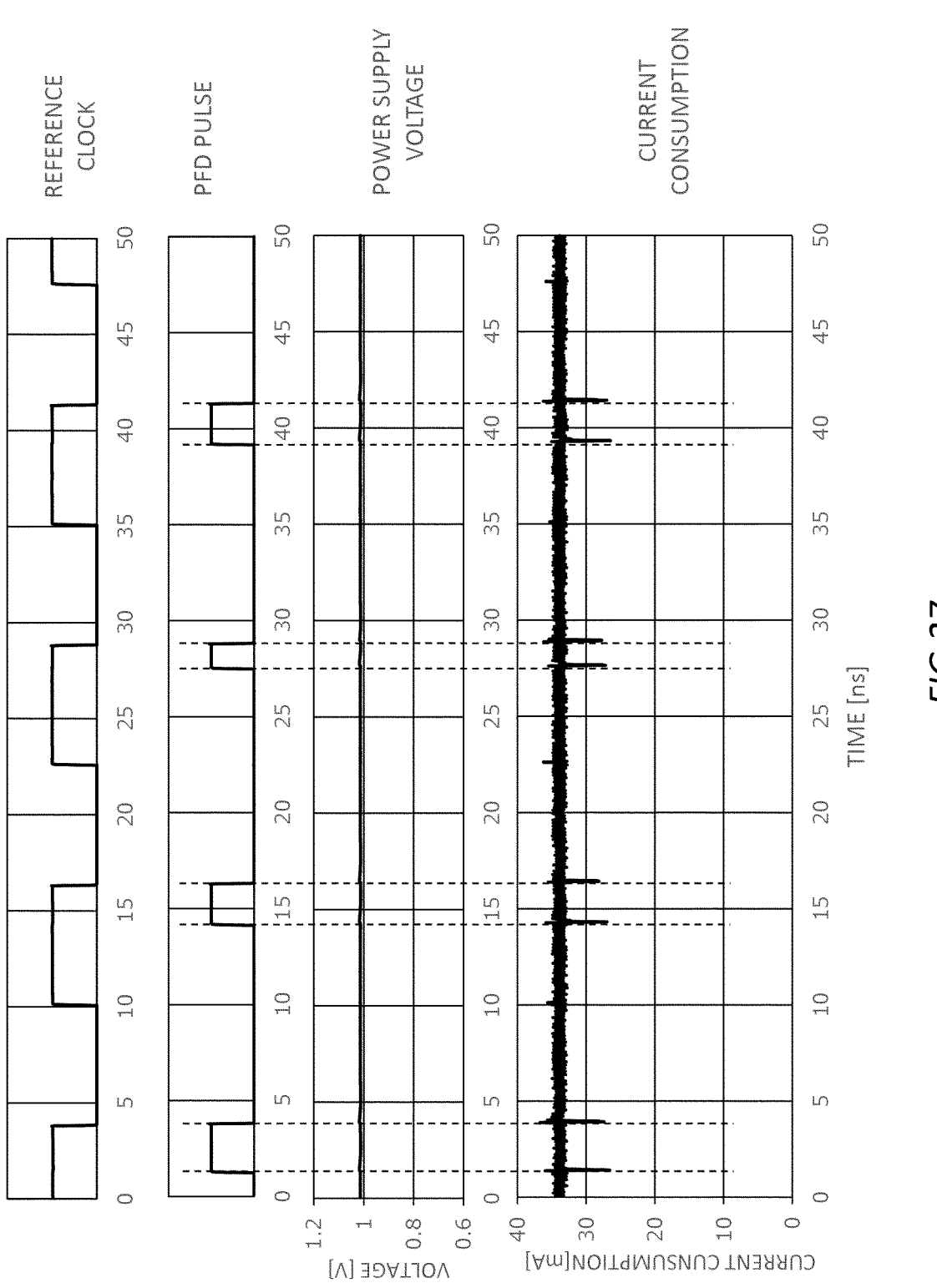
FIG. 27 illustrates a diagram which depicts a variance of the power supply voltage in the TD converter 10 according to the first embodiment.

FIG. 27 illustrates a diagram which depicts a variance of the power supply voltage in the TD converter 10 according to the first embodiment. In the present figure, the vertical axes indicate, from the top, a reference clock, a PFD pulse, a power supply voltage, and a current consumption, and the horizontal axis indicates a time. For obtaining the simulation result illustrated in the present figure, similarly to obtaining the simulation result illustrated in FIG. 17, the ring oscillator is operate with while switching the delay time of the inverter to be a higher speed.

In FIG. 17, a change in the current consumption in accordance with a change in the PFD pulse results in a change in the power supply voltage. However, in the present figure, almost no change occurs in the power supply voltage in accordance with a change in the PFD pulse. This attributes to two oscillators 400, the first oscillator 400A and the second oscillator 400B in the TD converter 10 according to the first embodiment, operating in operating modes different from each other in the complementary manner, which makes the total current consumption of two oscillators 400 constant, as illustrated in the present figure. In this manner, the power supply voltage does not change in the TD converter 10 according to the first embodiment in accordance with the PFD pulse, and the oscillator 400 operates under an ideal power supply voltage at all times, which prevents an error of the digital output value due to a change in the power supply voltage and allows implementation of a more accurate TD conversion.

Figure 28:
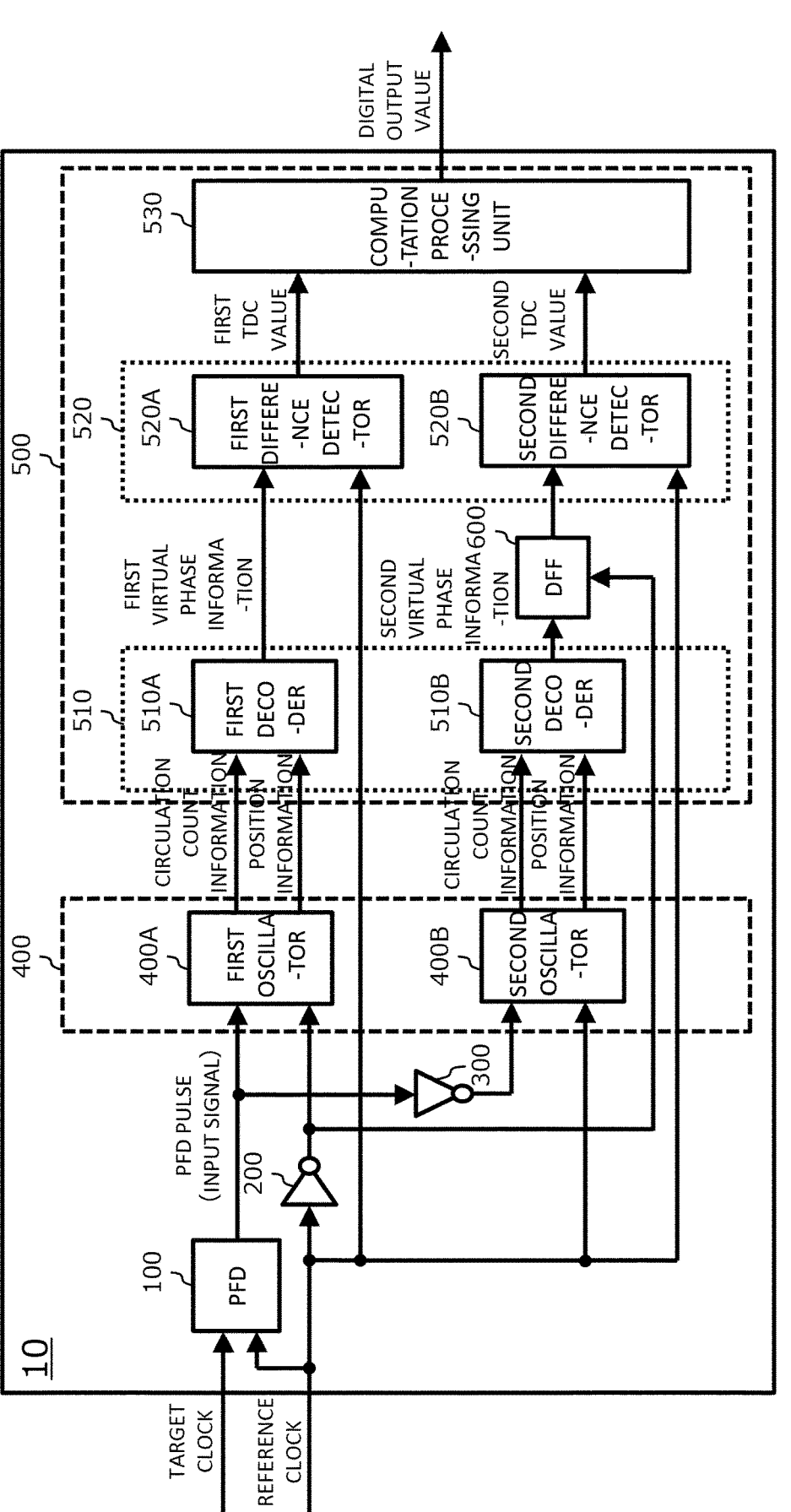
FIG. 28 illustrates an example configuration of the TD converter 10 according to the second embodiment.

FIG. 28 illustrates an example configuration of the TD converter 10 according to the second embodiment. In the present figure, components having the same function and configuration as in FIG. 18 are given the same reference numerals, and the following describes only differing points. In the first embodiment, provided is one example where the first oscillator 400A and the second oscillator 400B retain phase information according to clock signals of the same polarity (signals having an inverted polarity with respect to the reference clock). However, in the second embodiment, the first oscillator 400A and the second oscillator 400B may retain phase information according to clock signals of different polarities.

In the first embodiment, the second oscillator 400B receives an output of the second NOT circuit 300 and an output of the first NOT circuit 200 input thereto. In the second embodiment, the second oscillator 400B may receive an output of the second NOT circuit 300 and the reference clock input thereto. Therefore, in the second embodiment, while the first oscillator 400A retains phase information according to a signal having an inverted polarity with respect to the reference clock, the second oscillator 400B may retain phase information according to the reference clock. In the second embodiment, the first oscillator 400A and the second oscillator 400B may retain phase information according to the clock signals of different polarities in this manner, for example.

In addition, the TD converter 10 according to the second embodiment may further include a DFF 600. The DFF 600 may receive second virtual phase information calculated by the second decoder 510B and an output of the first NOT circuit 200 input thereto. Then, the DFF 600 may fetch an output of the second decoder 510B with a clock signal of the same polarity as that of the first oscillator 400A (a signal having an inverted polarity with respect to the reference clock) and subsequently output it to the second difference detector 520B.

Note that, as another example configuration, the DFF 600 may receive the reference clock input thereto and input an output of the first NOT circuit 200 to the second difference detector 520B. That is, a clock used for the DFF 600 may have the same polarity as a clock used for the second oscillator 400B, and a clock used for the second difference detector 520B may have an opposite polarity to a clock used for the first difference detector 520A.

Figure 29:
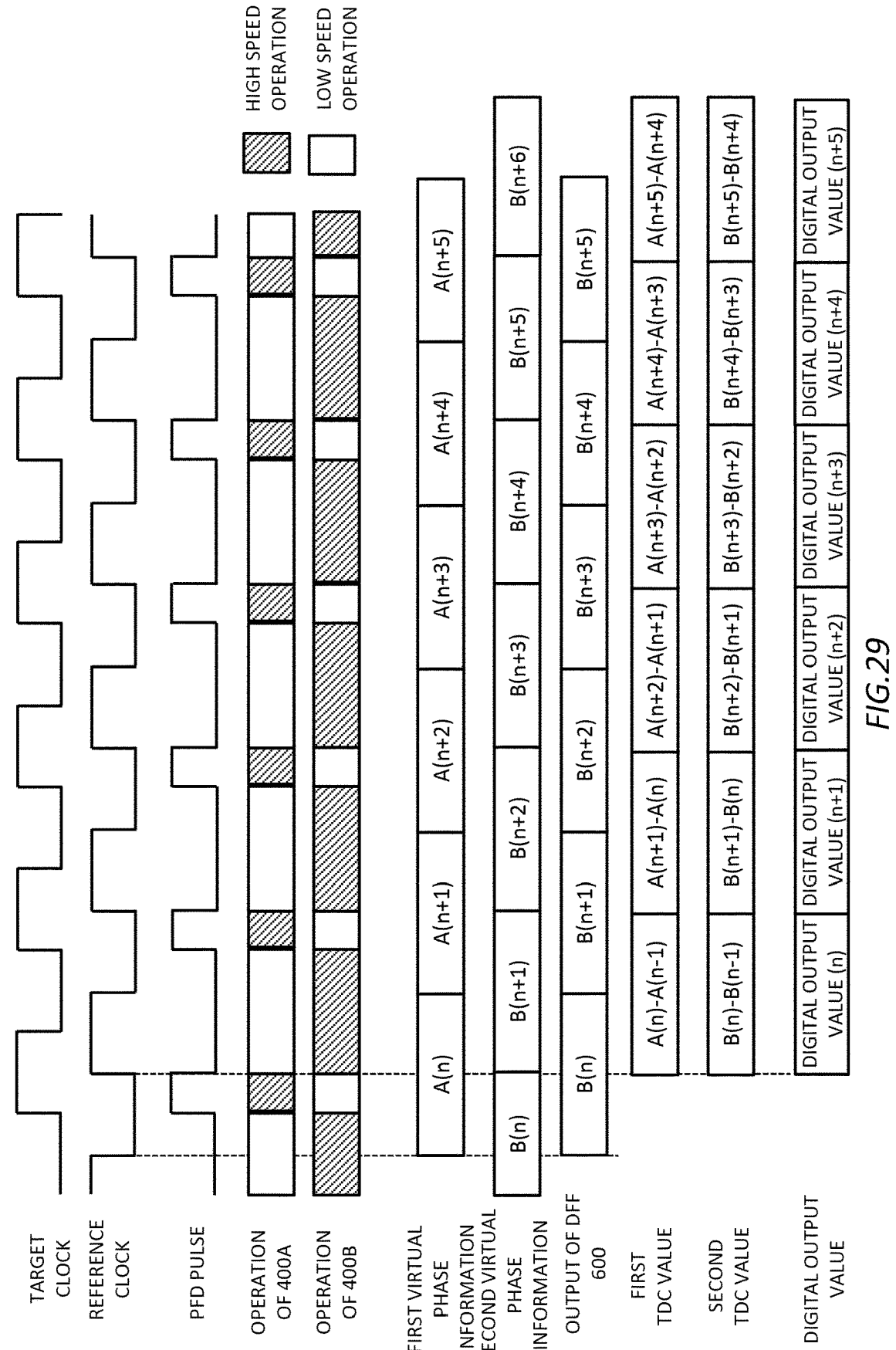
FIG. 29 illustrates an example of a timing chart of the TD converter 10 according to the second embodiment.

FIG. 29 illustrates an example of a timing chart of the TD converter 10 according to the second embodiment. In the present figure, the vertical axis indicates, from the top, the target clock, the reference clock, the PFD pulse, the operating mode of the first oscillator 400A, the operating mode of the second oscillator 400B, the first virtual phase information, the second virtual phase information, an output of the DFF 600, the first TDC value, the second TDC value, and the digital output value, and the horizontal axis indicates a time.

In the first embodiment, the second virtual phase information is updated at the timing of the trail of the reference clock in the same manner as the first virtual phase information. On the other hand, in the second embodiment, the second virtual phase information is updated at the timing of the rise of the reference clock. Then, the output of the DFF 600 is updated at the timing of the trail of the reference clock.

In the first embodiment, the second virtual phase information is obtained while the second oscillator 400B operates in the high speed operating mode. However, in the second embodiment, the second virtual phase information can be obtained at the timing immediately before the second oscillator 400B terminates the low speed operating mode. Therefore, speeds of the required corresponding operations of the latch circuit and the circulation counter included in the second oscillator 400B can be reduced.

Figure 30:
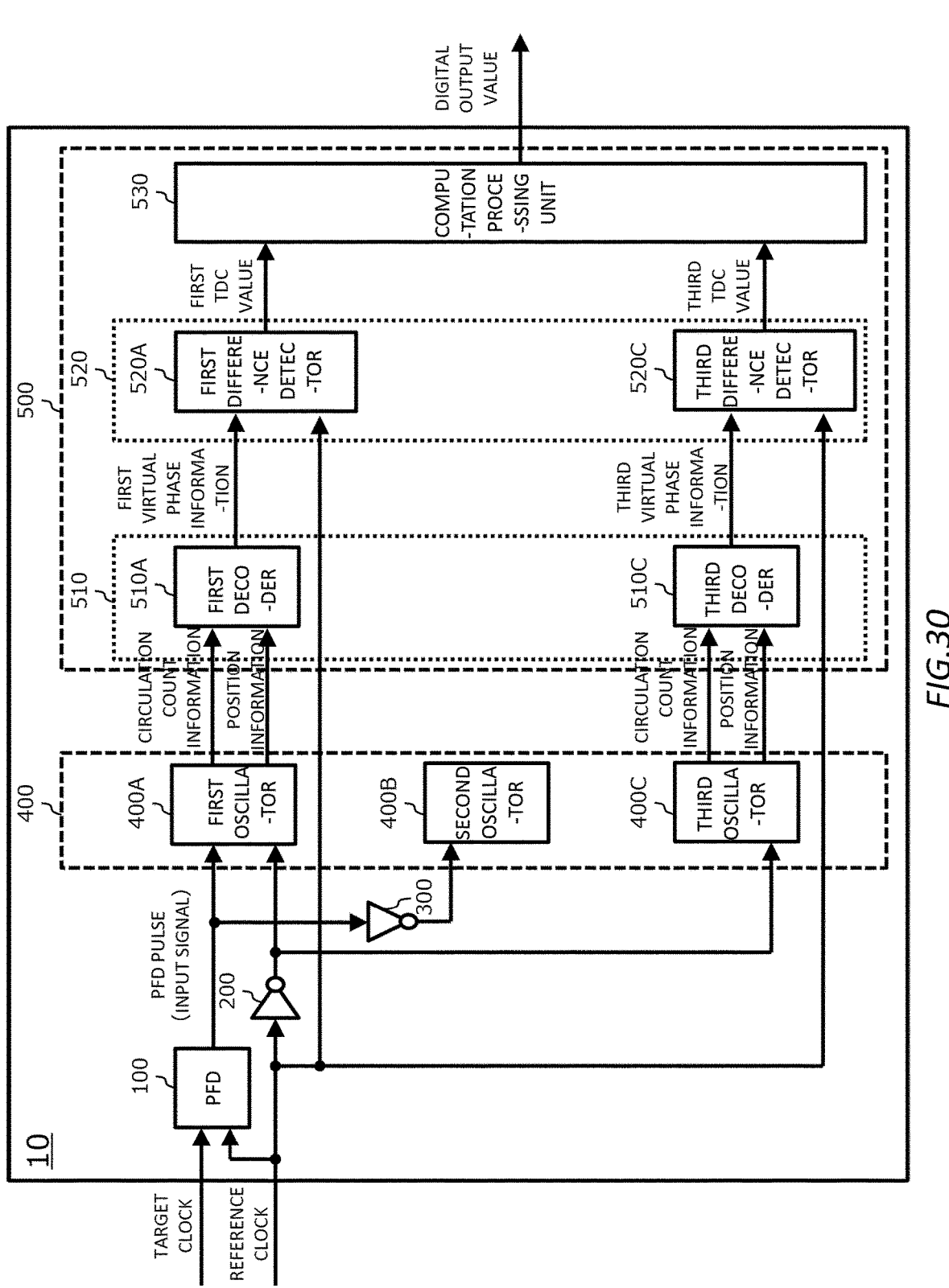
FIG. 30 illustrates an example configuration of the TD converter 10 according to the third embodiment.

FIG. 30 illustrates an example configuration of the TD converter 10 according to the third embodiment. In the present figure, components having the same function and configuration as in FIG. 18 are given the same reference numerals, and the following describes only differing points. In the third embodiment, a plurality of oscillators 400 may further include a third oscillator 400C. Then, in the third embodiment, the second oscillator 400B may only receive an output of the second NOT circuit 300 input thereto, but an output of the first NOT circuit 200 may not be input. That is, the second oscillator 400B may only need to operate in the operating mode different from that of the first oscillator 400A, but may not be required to retain the phase information. Therefore, in the third embodiment, a plurality of decoders 510 may not include the second decoder 510B. In addition, a plurality of difference detectors 520 may not include the second difference detector 520B. On the other hand, the plurality of decoders 510 may include a third decoder 510C. In addition, the plurality of difference detectors 520 may include a third difference detector 520C.

It is desired that the third oscillator 400C also has, similarly to the first oscillator 400A and the second oscillator 400B, the same circuit configuration and the same circuit arrangement to exhibit the same electrical characteristics as far as possible.

The third oscillator 400C may receive an output of the first NOT circuit 200 (that is, a signal having an inverted polarity with respect to the reference clock) input thereto. On the other hand, none of signals may be input to the third oscillator 400C as a control signal to control the operating mode. That is, the third oscillator 400C may operate at a constant oscillation frequency at all times, independently of the pulse width of the PFD pulse. That is, in the third embodiment, while the first oscillator 400A switches the operating mode with the PFD pulse as a control signal and the second oscillator 400B switches the operating mode with a signal having an inverted polarity with respect to the PFD pulse as a control signal, the third oscillator 400C may continue to operate in the fixed operating mode with a constant oscillation frequency at all times. Note that, in the present figure, provided is one example where only a pair of oscillators 400 (the first oscillator 400A and the second oscillator 400B) operate in the high speed operating mode and the low speed operating mode in the complementary manner, and only one oscillator 400 (the third oscillator 400C) operates in the fixed operating mode. However, this is provided without limitation. A plurality of pairs of the oscillators 400 may operate in the high speed operating mode and the low speed operating mode in the complementary manner, a plurality of oscillators 400 may operate in the fixed operating mode, and a plurality of pairs of oscillators 400 operate in the high speed operating mode and the low speed operating mode in the complementary manner while a plurality of oscillators 400 may operate in the fixed operating mode.

The third oscillator 400C retains, similarly to the first oscillator 400A, phase information according to the reference clock (a signal having an inverted polarity with respect to the reference clock in the present figure). Such phase information may include circulation count information and position information.

The third decoder 510C may calculate, similarly to the first decoder 510A, third virtual phase information by using the circulation count information and the position information included in the phase information retained by the third oscillator 400C.

The third difference detector 520C may detect, similarly to the first difference detector 520A, a third TDC value indicating a difference between the input third virtual phase information and the third virtual phase information at the time when the reference clock is one clock earlier.

The computation processing unit 530 may calculate a digital output value depending on a time difference between the reference clock and the target clock, based on the first TDC value detected by the first difference detector 520A and the third TDC value detected by the third difference detector 520C. Details of the computation processing unit 530 according to the third embodiment will be illustrated in the next figure.

Figure 31:
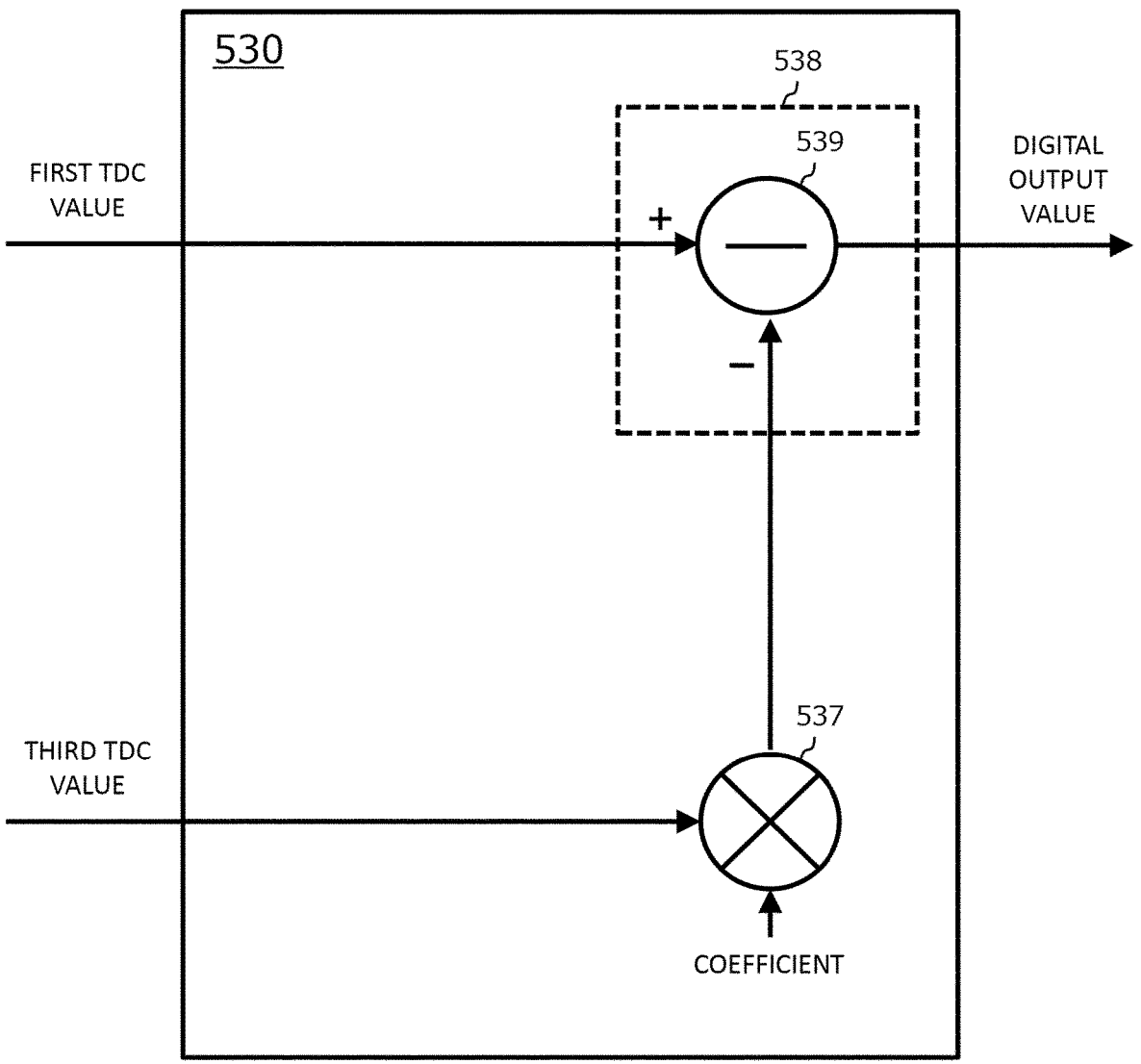
FIG. 31 illustrates the fourth example configuration of the computation processing unit 530.

FIG. 31 illustrates the fourth example configuration of the computation processing unit 530. In the present figure, components having the same function and configuration as in FIG. 22 are given the same reference numerals, and the following describes only differing points. The computation processing unit 530 according to the fourth example configuration may not include the dependent value extracting unit 532 and the independent value extracting unit 534. In addition, the multiplier 537 may multiply the third TDC value by a predetermined coefficient. Then, the second subtractor 539 may compute a difference between the first TDC value and an output of the multiplier 537 to output the difference as a digital output value.

Figure 32:
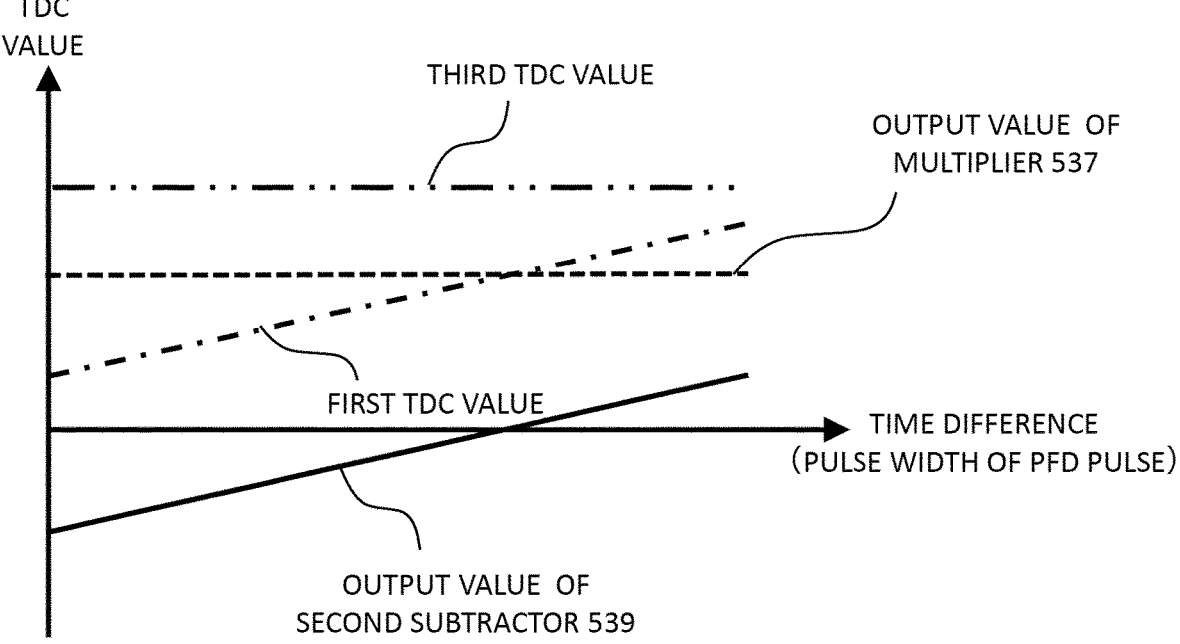
FIG. 32 illustrates situations of computation by the computation processing unit 530 according to the fourth example configuration.

FIG. 32 illustrates situations of computation by the computation processing unit 530 according to the fourth example configuration. In the present figure, the vertical axis indicates a TDC value, and the horizontal axis indicates a time difference between the reference clock and the target clock, that is, a pulse width of the PFD pulse. In addition, in the present figure, the one-dot chain line indicates the first TDC value, the double-dot dashed line indicates the third TDC value, the dotted line indicates an output value of the multiplier 537, and the solid line indicates an output value of the second subtractor 539.

The first TDC value increases when the pulse width of the PFD pulse is longer so that the ratio of time increases for one cycle when the first oscillator 400A operates in the high speed operating mode. Therefore, the first TDC value has a positive gradient. On the other hand, the third TDC value is a constant output independent of the pulse width of the PFD pulse, as the third oscillator 400C operates at a constant oscillation frequency at all times. The multiplier 537 may multiply the third TDC value which is a value substantially constant with respect to the pulse width in this manner by a predetermined appropriate coefficient. Then, the second subtractor 539 may compute a difference between the first TDC value and an output of the multiplier 537 to obtain a final digital output value.

The TD converter 10 according to the third embodiment can also control a zero cross point of the TDC output with a coefficient in the multiplier 537 in this manner, for example. Therefore, the PLL circuit using such a TD converter 10 can also control a phase state to lock the PLL. In addition, if the power supply voltage decreases or increases at a speed sufficiently slower than the cycle of the reference clock, operation speeds of the first oscillator 400A and the third oscillator 400C decrease or increase at the same ratio so that the first TDC value and the third TDC value decrease or increase at the same ratio. This maintains the zero cross point of the digital output value finally obtained unchanged so that the power supply does not change the phase difference at which the PLL circuit transits to the locked state.

In addition, two oscillators 400, the first oscillator 400A and the second oscillator 400B in the TD converter 10 according to the third embodiment, also operate in operating modes different from each other in the complementary manner, which makes the total current consumption of two oscillators 400 constant. Therefore, a change in the power supply voltage does not occur in accordance with the PFD pulse such that the oscillator 400 operates under an ideal power supply voltage at all times. This can prevent from an error of the digital output value due to a change in the power supply voltage and allows implementation of a more accurate TD conversion.

Figure 33:
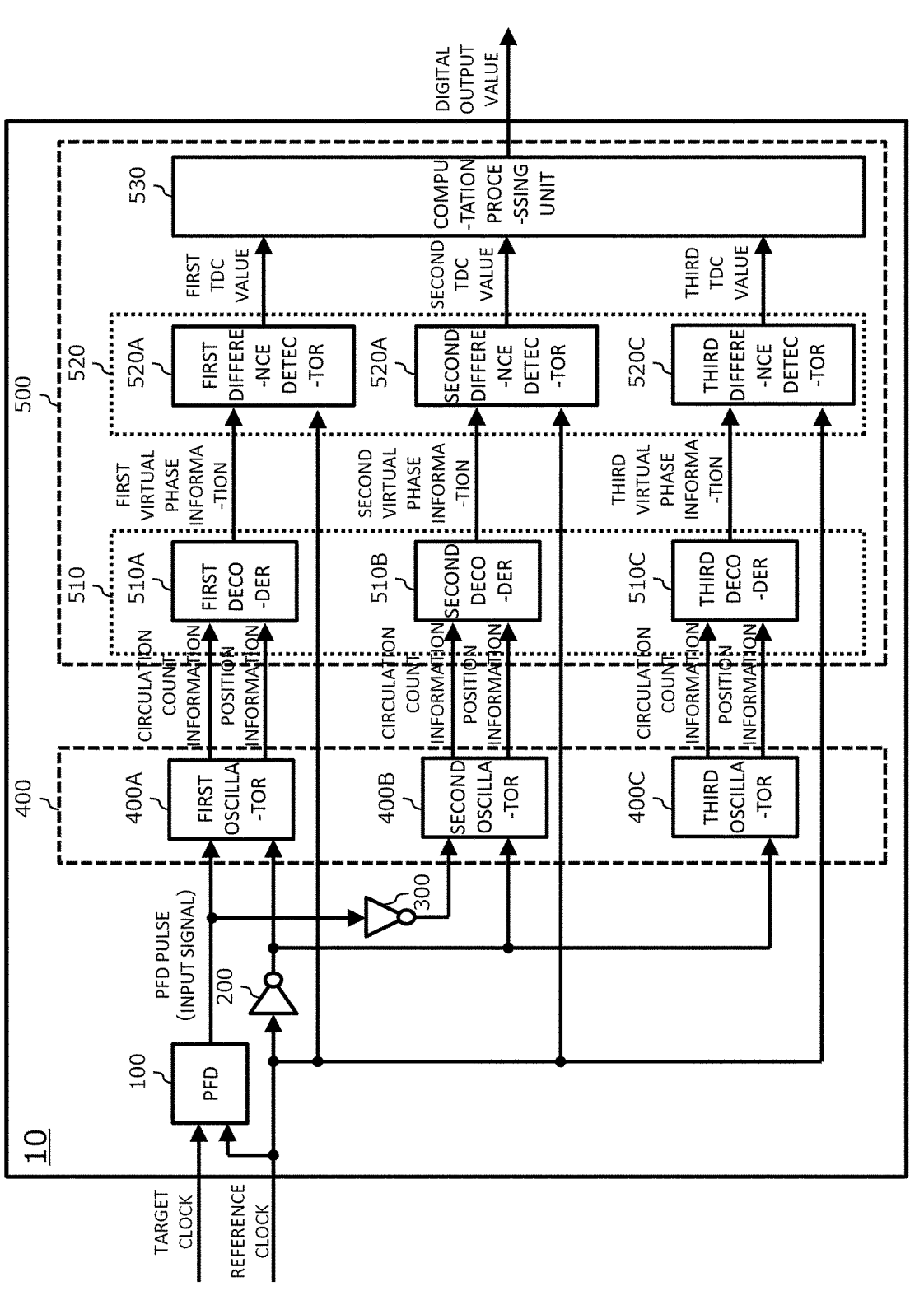
FIG. 33 illustrates an example configuration of the TD converter 10 according to the fourth embodiment.

FIG. 33 illustrates an example configuration of the TD converter 10 according to the fourth embodiment. In the present figure, components having the same function and configuration as in FIG. 18 and FIG. 30 are given the same reference numerals, and the following describes only differing points. The TD converter 10 according to the fourth embodiment includes the third oscillator 400C, the third decoder 510C, and the third difference detector 520C in the TD converter 10 according to the third embodiment, in addition to the TD converter 10 according to the first embodiment. Note that, in the present figure, provided is one example where only a pair of oscillators 400 (the first oscillator 400A and the second oscillator 400B) operate in the high speed operating mode and the low speed operating mode in the complementary manner, and only one oscillator 400 (the third oscillator 400C) operates in the fixed operating mode. However, this is provided without limitation. A plurality of pairs of the oscillators 400 may operate in the high speed operating mode and the low speed operating mode in the complementary manner, a plurality of oscillators 400 may operate in the fixed operating mode, and a plurality of pairs of oscillators 400 operate in the high speed operating mode and the low speed operating mode in the complementary manner while a plurality of oscillators 400 may operate in the fixed operating mode. Details of the computation processing unit 530 according to the fourth embodiment will be illustrated in the next figure.

Figure 34:
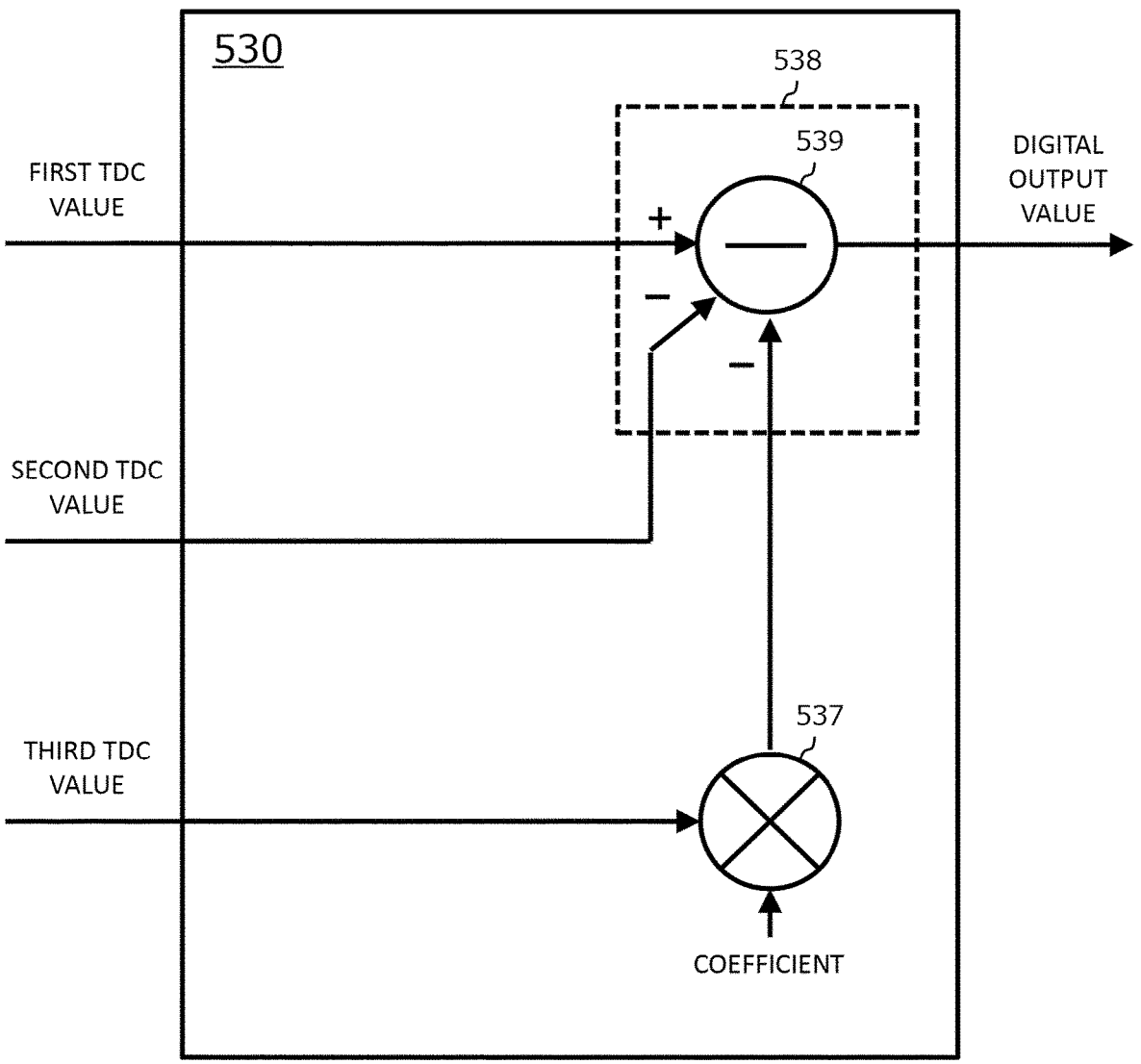
FIG. 34 illustrates the fifth example configuration of the computation processing unit 530.

FIG. 34 illustrates the fifth example configuration of the computation processing unit 530. In the present figure, components having the same function and configuration as in FIG. 31 are given the same reference numerals, and the following describes only differing points. In the computation processing unit 530 according to the fourth example configuration, the second subtractor 539 may compute a difference between the first TDC value and a sum of the second TDC value and an output of the multiplier 537, to output the difference as a digital output value.

Figure 35:
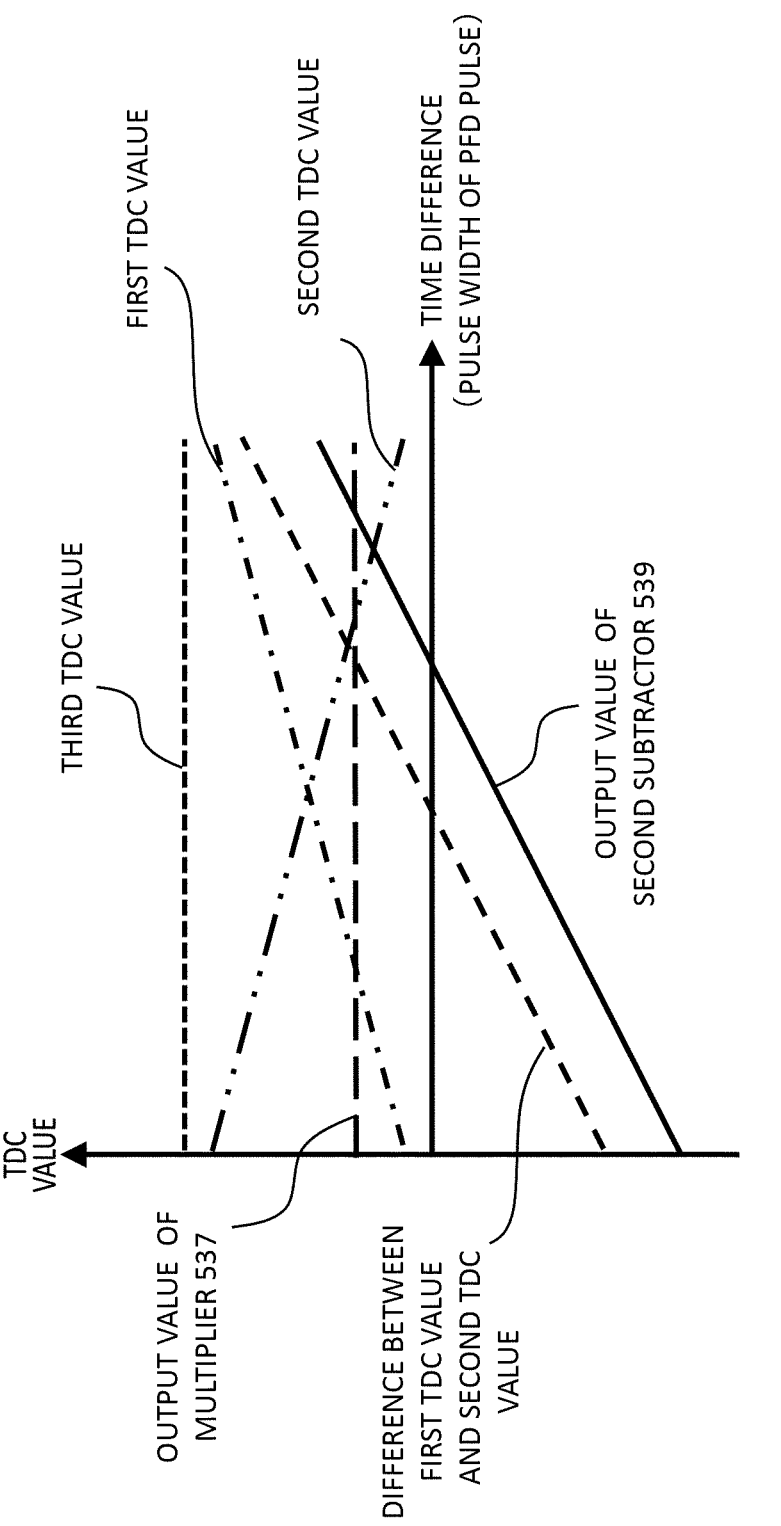
FIG. 35 illustrates situations of computation by the computation processing unit 530 according to the fifth example configuration.

FIG. 35 illustrates situations of computation by the computation processing unit 530 according to the fifth example configuration. In the present figure, the vertical axis indicates a TDC value, and the horizontal axis indicates a time difference between the reference clock and the target clock, that is, a pulse width of the PFD pulse. In addition, in the present figure, the one-dot chain line indicates the first TDC value, the double-dot dashed line indicates the second TDC value, the dotted line indicates the third TDC value, the dashed line indicates a difference between the first TDC value and the second TDC value, the longer dashed line indicates an output value of the multiplier 537, and the solid line indicates an output value of the second subtractor 539.

The first TDC value increases when the pulse width of the PFD pulse is longer so that the ratio of time increases for one cycle when the first oscillator 400A operates in the high speed operating mode. Therefore, the first TDC value has a positive gradient. On the other hand, the second TDC value decreases when the pulse width of the PFD pulse is longer so that the ratio of time increases for one cycle when the second oscillator 400B operates in the low speed operating mode. Therefore, the second TDC value has a negative gradient. Therefore, the difference between the first TDC value and the second TDC value provides a response which further largely changes in accordance with the pulse width of the PFD pulse. In this example subtracting the second TDC value from the first TDC value, the response has a positive gradient.

In addition, the third TDC value is a constant output independent of the pulse width of the PFD pulse, as the third oscillator 400C operates at a constant oscillation frequency at all times. The multiplier 537 may multiply the third TDC value which is a value substantially constant with respect to the pulse width in this manner by a predetermined appropriate coefficient. Then, the second subtractor 539 may obtain a final digital output value by subtracting the output value of the multiplier 537 from the difference between the first TDC value and the second TDC value.

The TD converter 10 according to the fourth embodiment can also control a zero cross point of the TDC output with a coefficient in the multiplier 537 in this manner, for example. Therefore, the PLL circuit using such a TD converter 10 can also control a phase state to lock the PLL. In addition, if the power supply voltage decreases or increases at a speed sufficiently slower than the cycle of the reference clock, operation speeds of the first oscillator 400A, the second oscillator 400B, and the third oscillator 400C decrease or increase at the same ratio so that the first TDC value, the second TDC value, and the third TDC value decrease or increase at the same ratio. This maintains the zero cross point of the digital output value finally obtained unchanged so that the power supply does not change the phase difference at which the PLL circuit transits to the locked state.

In addition, two oscillators 400, the first oscillator 400A and the second oscillator 400B in the TD converter 10 according to the fourth embodiment, also operate in operating modes different from each other in the complementary manner, which makes the total current consumption of two oscillators 400 constant. Therefore, a change in the power supply voltage does not occur in accordance with the PFD pulse such that the oscillator 400 operates under an ideal power supply voltage at all times. This can prevent from an error of the digital output value due to a change in the power supply voltage and allows implementation of a more accurate TD conversion.

Figure 36:
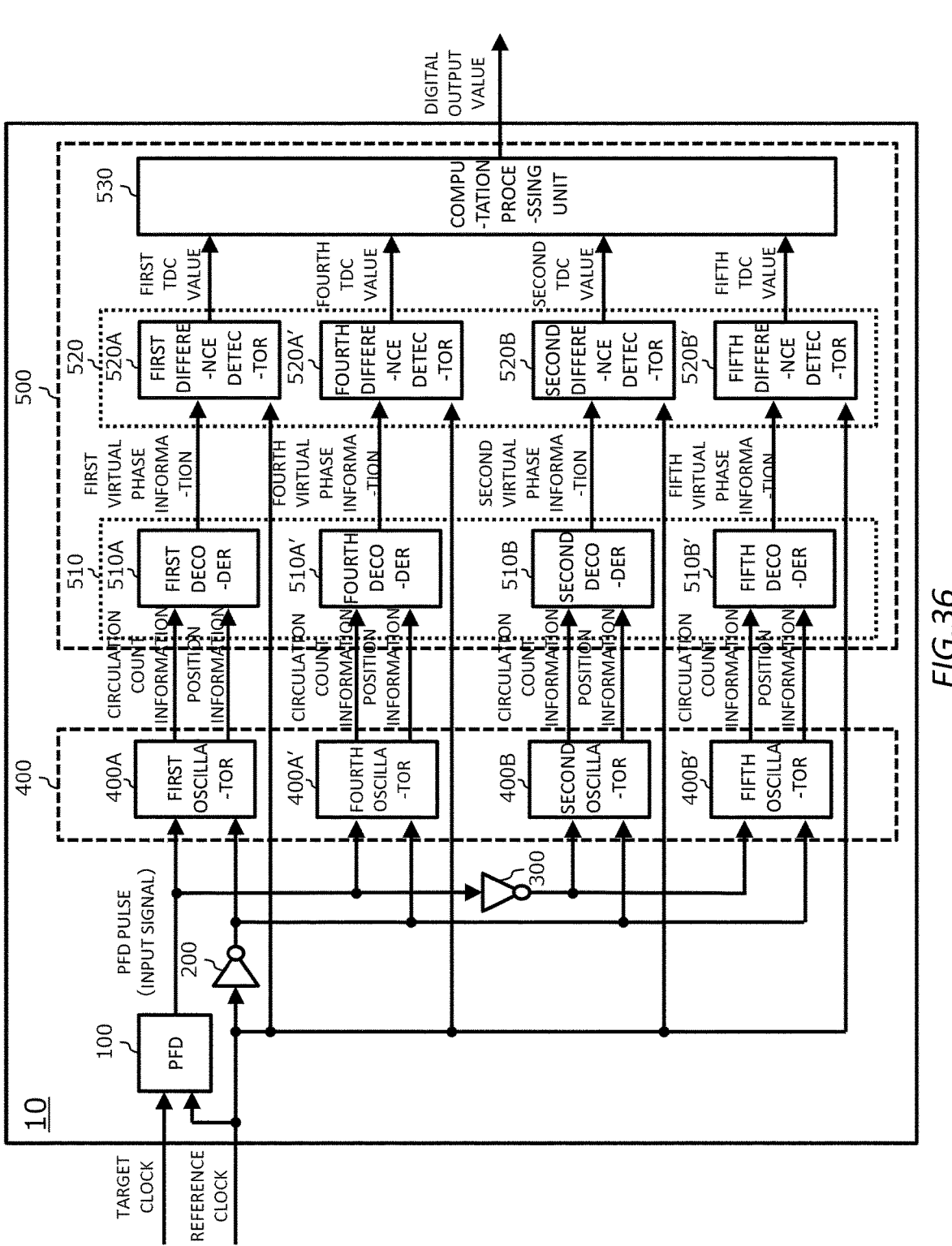
FIG. 36 illustrates an example configuration of the TD converter 10 according to the fifth embodiment.

FIG. 36 illustrates an example configuration of the TD converter 10 according to the fifth embodiment. In the present figure, components having the same function and configuration as in FIG. 18 are given the same reference numerals, and the following describes only differing points. In the TD converter 10 according to the first embodiment, provided is one example where a pair of oscillators 400 (the first oscillator 400A and the second oscillator 400B) operate in the different operating modes in the complementary manner. On the other hand, in the TD converter 10 according to the fifth embodiment, two pairs of the oscillators 400 may operate in the different operating modes in the complementary manner.

In the TD converter 10 according to the fifth embodiment, a plurality of oscillators 400 may further include a fourth oscillator 400A' and a fifth oscillator 400B'. The fourth oscillator 400A' may be similar to the first oscillator 400A and the fifth oscillator 400B' may be similar to the second oscillator 400B. Therefore, the explanation is omitted here.

In addition, a plurality of decoders 510 may further include a fourth decoder 510A' and a fifth decoder 510B'. The fourth decoder 510A' may be similar to the first decoder 510A and the fifth decoder 510B' may be similar to the second decoder 510B. Therefore, the explanation is omitted here.

In addition, a plurality of difference detectors 520 may further include a fourth difference detector 520A' and a fifth difference detector 520B'. The fourth difference detector 520A' may be similar to the first difference detector 520A and the fifth difference detector 520B' may be similar to the second difference detector 520B. Therefore, the explanation is omitted here. The fourth difference detector 520A' is to detect a fourth TDC value and the fifth difference detector 520B' is to detect a fifth TDC value. Details of the computation processing unit 530 according to the fifth embodiment will be illustrated in the next figure.

Figure 37:
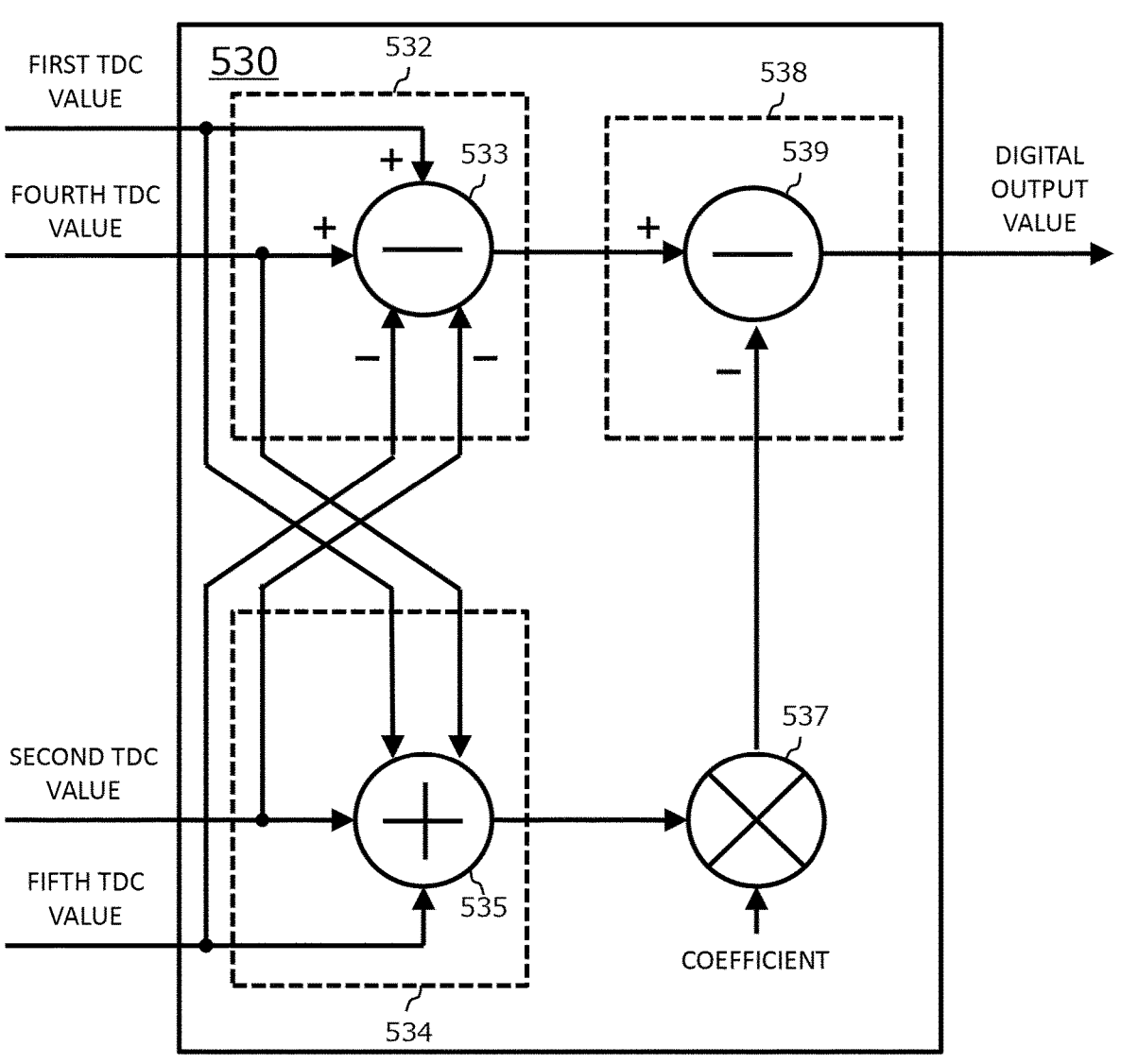
FIG. 37 illustrates the sixth example configuration of the computation processing unit 530.

FIG. 37 illustrates the sixth example configuration of the computation processing unit 530. In the present figure, components having the same function and configuration as in FIG. 22 are given the same reference numerals, and the following describes only differing points. In the computation processing unit 530 according to the sixth example configuration, the first subtractor 533 may subtract the second TDC value and the fifth TDC value from a sum of the first TDC value and the fourth TDC value. In addition, the adder 535 may sum up all of the first TDC value, the second TDC value, the fourth TDC value, and the fifth TDC value.

The TD converter 10 according to the sixth embodiment can reduce an influence of a quantization noise generated in each point and other noises generated when the oscillator 400 operates to an inverse of sqrt 2, as compared to the first embodiment. Note that, in foregoing description, provided is one example where two pairs of oscillators 400 operate in the different operating modes in the complementary manner. However, the number of pairs of the oscillators 400 which operate in the complementary manner is not limited to two, but can be extended to N. In this case, an influence of noises is an inverse of sqrt N and thus a further effect of noise reduction can be expected. However, as a current consumption is required to be constant at all times, the number of the oscillators 400 which operate simultaneously at a high speed and the number of the oscillators 400 which operate at a low speed are required to be the same.

As described using various embodiments so far, the TD converter 10 may be provided to be able to reduce a change in the current consumption during the gating operation as far as possible, thereby preventing occurrence of switching of the power supply voltage and reducing a noise due to a switching noise in the TD conversion. In addition, the PLL circuit including such a TD converter 10 may be provided. Note that, although the respective embodiments are described individually in the foregoing description, these embodiments may be performed in combination with other embodiments as appropriate unless they are inconsistent with one another in particular.

While the present invention has been described by way of the embodiments, the technical scope of the present invention is not limited to the above described embodiment. It is apparent to persons skilled in the art that various alterations and improvements can be added to the above described embodiment. It is also apparent from the description of the claims that the embodiments to which such alterations or improvements are made can be included in the technical scope of the present invention.

The operations, procedures, steps, and stages of each process performed by a device, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

EXPLANATION OF REFERENCES

10: TD converter, 100: PFD circuit, 200: first NOT circuit, 300: second NOT circuit, 400: oscillator, 410: delay element, 500: computation circuit, 510: decoder, 520: difference detector, 530: computation processing unit, 532: dependent value extracting unit, 533: first subtractor, 534: independent value extracting unit, 535: adder, 537: multiplier, 538: difference output unit, 539: second subtractor, 600: DFF.

What is claimed is:

1. A TD converter comprising:

a plurality of oscillators which at least include a first oscillator and a second oscillator receiving control signals input thereto, respectively, and operating in operating modes with oscillation frequencies different from each other, respectively, wherein each control signal indicates a time difference between a reference clock and a target clock; and a computation circuit which calculates a digital output value depending on the time difference, by using a plurality of pieces of phase information retained according to the reference clock in the plurality of oscillators, respectively;

wherein each of the first oscillator and the second oscillator is configured to be operable in at least two operating modes including a high speed operating mode and a low speed operating mode, the oscillation frequency of which is lower than that of the high speed operating mode.

2. The TD converter according to claim 1, wherein the second oscillator operates in the low speed operating mode when the first oscillator operates in the high speed operating mode, and the second oscillator operates in the high speed operating mode when the first oscillator operates in the low speed operating mode.

3. The TD converter according to claim 1, wherein each of the plurality of oscillators includes a ring oscillator formed by delay elements cascaded in a ring shape.

4. The TD converter according to claim 3, wherein each of the first oscillator and the second oscillator is configured to enable switch of the operating mode by switching a delay time in the delay element in accordance with the control signal.

5. The TD converter according to claim 3, wherein each of the plurality of pieces of phase information includes circulation count information which indicates a circulation count of the ring oscillator, and position information which indicates a position of the delay element at which a logic level of an input is equal to a logic level of an output.

6. The TD converter according to claim 5, wherein the computation circuit includes:

a plurality of decoders which calculate, for the plurality of pieces of phase information, virtual phase information indicating information of a virtual phase by using the circulation count information and the position information, respectively;

a plurality of difference detectors which receive a plurality of pieces of virtual phase information input thereto, respectively, wherein the plurality of pieces of virtual phase information are calculated by the plurality of decoders, and detect a TDC value indicating a difference between the input virtual phase information and the virtual phase information at the time when the reference clock is one clock earlier, respectively; and a computation processing unit which calculates the digital output value based on a plurality of TDC values detected by the plurality of difference detectors.

7. The TD converter according to claim 6, wherein the computation processing unit includes a dependent value extracting unit which extracts, from each of the plurality of TDC values, a dependent value indicating a value that changes depending on the time difference.

8. The TD converter according to claim 7, wherein the dependent value extracting unit is configured with a subtractor which computes a difference between a first TDC value and a second TDC value of the plurality of TDC values.

9. The TD converter according to claim 7, wherein the dependent value extracting unit outputs the dependent value as the digital output value.

10. The TD converter according to claim 7, wherein the computation processing unit further includes:

an independent value extracting unit which extracts, from each of the plurality of TDC values, an independent value indicating a value independent of the time difference; and a difference output unit which computes a difference between the dependent value and the independent value, and outputs the difference as the digital output value.

11. The TD converter according to claim 10, wherein the independent value extracting unit is configured with an adder which computes a sum of a first TDC value and a second TDC value of the plurality of TDC values.

12. The TD converter according to claim 10, wherein the computation processing unit further includes a multiplier which multiplies the dependent value or the independent value by a predetermined coefficient.

13. The TD converter according to claim 1, wherein the control signal is a pulse signal having a pulse width depending on a time difference between the reference clock and the target clock.

14. The TD converter according to claim 1, wherein the control signal is a pulse signal having a pulse width depending on a time difference between the reference clock and the target clock.

15. The TD converter according to claim 2, wherein the control signal is a pulse signal having a pulse width depending on a time difference between the reference clock and the target clock.

16. The TD converter according to claim 1, wherein the plurality of oscillators are two oscillators which are the first oscillator and the second oscillator.

17. A PLL circuit comprising the TD converter according to claim 1.

18. A TD converting method comprising:

by a first oscillator and a second oscillator of a plurality of oscillators, receiving control signals input thereto, respectively, and operating in operating modes with oscillation frequencies different from each other, respectively, wherein each control signal indicates a time difference between a reference clock and a target clock; and by a computation circuit, calculating a digital output value depending on the time difference, by using a plurality of pieces of phase information retained according to the reference clock in the plurality of oscillators, respectively;

wherein each of the first oscillator and the second oscillator is configured to be operable in at least two operating modes including a high speed operating mode and a low speed operating mode, the oscillation frequency of which is lower than that of the high speed operating mode.

19. A clock generating method comprising:

by a first oscillator and a second oscillator of a plurality of oscillators, receiving control signals input thereto, respectively, and operating in operating modes with oscillation frequencies different from each other, respectively, wherein each control signal indicates a time difference between a reference clock and a target clock;

by a computation circuit, calculating a digital output value depending on the time difference, by using a plurality of pieces of phase information retained according to the reference clock in the plurality of oscillators, respectively; and outputting an output clock with a frequency depending on the digital output value, wherein the plurality of oscillators receive a feedback clock depending on the output clock input thereto as the target clock;

wherein each of the first oscillator and the second oscillator is configured to be operable in at least two operating modes including a high speed operating mode and a low speed operating mode, the oscillation frequency of which is lower than that of the high speed operating mode.

20. A TD converter comprising:

a plurality of oscillators which at least include a first oscillator and a second oscillator receiving control signals input thereto, respectively, and operating in operating modes with oscillation frequencies different from each other, respectively, wherein each control signal indicates a time difference between a reference clock and a target clock; and a computation circuit which calculates a digital output value depending on the time difference, by using a plurality of pieces of phase information retained according to the reference clock in the plurality of oscillators, respectively;

wherein each of the plurality of oscillators includes a ring oscillator formed by delay elements cascaded in a ring shape; and wherein each of the first oscillator and the second oscillator is configured to enable switch of the operating mode by switching a delay time in the delay element in accordance with the control signal.

21. A TD converter comprising:

a plurality of oscillators which at least include a first oscillator and a second oscillator receiving control signals input thereto, respectively, and operating in operating modes with oscillation frequencies different from each other, respectively, wherein each control signal indicates a time difference between a reference clock and a target clock; and a computation circuit which calculates a digital output value depending on the time difference, by using a plurality of pieces of phase information retained according to the reference clock in the plurality of oscillators, respectively;

wherein each of the plurality of oscillators includes a ring oscillator formed by delay elements cascaded in a ring shape; and wherein each of the plurality of pieces of phase information includes circulation count information which indicates a circulation count of the ring oscillator, and position information which indicates a position of the delay element at which a logic level of an input is equal to a logic level of an output.

* * * * *